(12) United States Patent
Yu et al.

(10) Patent No.: US 9,153,785 B2
(45) Date of Patent: Oct. 6, 2015

(54) SEMICONDUCTING POLYMERS

(75) Inventors: Luping Yu, Chicago, IL (US); Hae Jung Son, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 14/111,473

(22) PCT Filed: Apr. 13, 2012

(86) PCT No.: PCT/US2012/033601
§ 371 (c)(1),
(2), (4) Date: Jan. 17, 2014

(87) PCT Pub. No.: WO2012/142469
PCT Pub. Date: Oct. 18, 2012

(65) Prior Publication Data
US 2014/0145119 A1    May 29, 2014

Related U.S. Application Data

(60) Provisional application No. 61/517,205, filed on Apr. 15, 2011.

(51) Int. Cl.
*C08G 59/00* (2006.01)
*H01L 51/00* (2006.01)
(Continued)

(52) U.S. Cl.
CPC .......... *H01L 51/0047* (2013.01); *C08G 61/123* (2013.01); *C08G 61/126* (2013.01); *H01L 51/0036* (2013.01); *H01L 51/0043* (2013.01); *C08G 2261/146* (2013.01); *C08G 2261/1412* (2013.01); *C08G 2261/1426* (2013.01); *C08G 2261/3243* (2013.01); *C08G 2261/91* (2013.01); *H01L 51/4253* (2013.01); *Y02E 10/549* (2013.01)

(58) Field of Classification Search
CPC ............ H01L 51/0036; C08G 2261/91; Y02E 10/549
USPC .......................................... 528/377, 380, 378
See application file for complete search history.

(56) References Cited

U.S. PATENT DOCUMENTS

| 7,183,418 | B2 | 2/2007 | Heeney et al. |
| 7,332,223 | B2 | 2/2008 | Sotzing et al. |
| 8,436,134 | B2 | 5/2013 | Yu et al. |

(Continued)

FOREIGN PATENT DOCUMENTS

| WO | WO 2008/011957 A1 | 1/2008 |
| WO | WO 2010/008672 A1 | 1/2010 |

(Continued)

OTHER PUBLICATIONS

International Search Report, International Application No. PCT/US2012/033601, Sep. 6, 2012, 2pages.
(Continued)

*Primary Examiner* — Shane Fang
(74) *Attorney, Agent, or Firm* — Brinks Gilson & Lione; Ryan L. Marshall

(57) ABSTRACT

Novel semiconducting photovoltaic polymers with conjugated units that provide improved solar conversion efficiency that can be used in electro-optical and electric devices. The polymers exhibit increased solar conversion efficiency in solar devices.

20 Claims, 11 Drawing Sheets a)

b)

(51) Int. Cl.
*C08G 61/12* (2006.01)
*H01L 51/42* (2006.01)

(56) References Cited

U.S. PATENT DOCUMENTS

| | | | |
|---|---|---|---|
| 2005/0082525 | A1 | 4/2005 | Heeney et al. |
| 2005/0209419 | A1 | 9/2005 | Zahn et al. |
| 2008/0102559 | A1 | 5/2008 | Ong et al. |
| 2008/0103286 | A1 | 5/2008 | Ong et al. |
| 2009/0014693 | A1* | 1/2009 | Zahn ............................ 252/510 |
| 2009/0018348 | A1* | 1/2009 | Zahn et al. ..................... 549/50 |
| 2009/0140219 | A1* | 6/2009 | Zahn ........................ 252/519.33 |
| 2011/0124822 | A1* | 5/2011 | Yu et al. ......................... 525/389 |
| 2014/0005347 | A1 | 1/2014 | Yu et al. |

FOREIGN PATENT DOCUMENTS

| | | |
|---|---|---|
| WO | WO 2010/020329 A1 | 2/2010 |
| WO | WO 2011/067192 A2 | 6/2011 |
| WO | WO 2011/156478 A2 | 12/2011 |

OTHER PUBLICATIONS

Ballantyne, Amy M., et al. Studies of Highly Regioregualr Poly(3-hexylselenophene) for Photovoltaic Applications in Advanced Materials, 19, pp. 4544-4547 (2007).

Heeney, Martin, et al. "Regioregular Poly(3-hexyl)selenophene: A Low Band Gap Organic Hole Transporting Polymer" The Royal Society of Chemistry Journal, pp. 5061-5063 (Oct. 1, 2007).

Patra, Asit, et al. "Poly(3,4-ethylenedioxyselenophene)" in JACS Communications, Dept. of Organic Chemistry and Chemical Research Support Unit, pp. 6734-6736 (May 6, 2008).

Patra, Asit, et al. "Tuning the Band Gap of Low-Band-Gap Polyselenophenes and Polythiophenes: The Effect of the Heteroatom" in Chemistry of Materials, 896-906 (Dec. 16, 2010).

Saadeh, Haythem A., et al. "Polyselenopheno[3,4b]selenophene for Highly Efficient Bulk Heterojunction Solar Cells" in American Chemical Society, pp. 361-365 (Feb. 9, 2012).

Salzner, U., et al. "Comparison of Geometries and Electronic Structures of Polyacetylene, Polyborole, Polycyclopentadiene, Polypyrrole, Polyfran, Polysilole, Polyphosphole, Polythiophene, Polyselenophene and Polytellurophene" in Synthetic Metals 96, pp. 177-189 (May 22, 1998).

Wijsboom, Yair, et al. "Controlling Rigidity and Planarity in Conjugated Polymers: Poly(3,4-ethylenedithioselenophene)" in Angewandte Chemical Int. Ed, pp. 5443-5447 (2009).

Zade, Sanjio S., et al. "From Oligomers to Polymer: Convergence in the HOMO-LUMO Gaps of Conjugated Oligomers" American Chemical Society, vol. 8, No. 23, pp. 5243-5246 (Aug. 17, 2006).

Chen, Hsiang-Yu et al., "Polymer Solar Cells with Enhanced Open-Circuit Voltage and Efficiency," Nature Photonics 3:649-653 (Nov. 2009).

Chen, et al., "Hierarchical Nanomorphologies Promote Exciton Dissociation in Polymer/Fullerene Bulk Heterojunction Solar Cells," Nano Letters, vol. 11, pp. 3707-3713 (2011).

Facchetti, "Pi-Conjugated Polymers for Organic Electronics and Photovoltaic Cell Application," Chemistry of Materials, vol. 23, pp. 733-758 (2011).

First Office Action with English Translation in related Chinese Patent Application No. 200980135645.3, issued Mar. 28, 2012 (6 pages).

Huo, Lijun et al., "Replacing Alkoxy Groups with Alkylthienyl Groups: A Feasible Approach to Improve the Properties of Photovoltaic Polymers," Angewandte Chemie International Edition, 50:9697-9702 (2011).

International Search Report for PCT/US2009/044364, dated Aug. 27, 2009, 3 pages.

International Search Report for PCT/US2013/024337, dated Apr. 16, 2013, 3 pages.

Liang, Y., et al., "Control in Energy Levels of Conjugated Polymers for Photovoltaic Application," J. Phys. Chem. C, vol. 112. pp. 7866-7871 (2008).

Liang, Yongye et al., "Development of New Semiconducting Polymers for High Performance Solar Cells," J. American Chemical Society Communications: Dept. of Chemistry and the James Franck Institute, The University of Chicago 131(1):56-57 (Dec. 2008).

Liang, Yongye et al., "Highly Efficient Solar Cell Polymers Developed via Fine-Tuning of Structural and Electronic Properties," J. American Chemical Society Articles: Dept. of Chemistry and the James Franck Institute, The University of Chicago 131:7792-7799 (May 2009).

Liang, Yongye, et al., "For the Bright Future—Bulk Heterojunction Polymer Solar Cells with Power Conversion Efficiency of 7.4%," Advanced Energy Materials, 22:E135-E138 (2010).

Notice of Preliminary Rejection in related South Korean Patent Application No. 10-2013-7030162, issued Dec. 17, 2014 (7 pages).

Second Office Action in related Chinese Patent Application No. 200980135645.3, issued Dec. 13, 2012 (3 pages).

Supplementary Search Report for EP Application No. 09798375.3, mailed Aug. 7, 2012 (5 pages).

Third Office Action in related Chinese Patent Application No. 200980135645.3, issued Jul. 3, 2013 (3 pages).

* cited by examiner

SEMICONDUCTING POLYMERS

CROSS-REFERENCE TO RELATED APPLICATION AND INCORPORATION BY REFERENCE

The present application is a 371 national phase of International Application No. PCT/US2012/033601, filed Apr. 13, 2012, which claims the benefit of U.S. Provisional Application No. 61/517,205, filed Apr. 15, 2011, the entirety of which is hereby incorporated by reference.

GOVERNMENT LICENSE RIGHTS

This invention was made with Government support under Grant No. DMR-1004195 and FA9550-09-1-0220, awarded by the National Science Foundation and the Air Force Office of Scientific Research. The Government may have certain rights to this invention.

TECHNICAL FIELD

This invention relates to semiconducting polymers based on semiconducting conjugated polymers. This invention also relates to their use in electro-optical and electronic devices.

BACKGROUND

In comparison to their inorganic counterpart, the bulk heterojunction (BHJ) polymer solar cells hold many advantages such as low cost of fabrication, ease of processing, flexibility and the potential of preparing large-area devices (Braga et al. Sol. Energy Mater. Sol. Cells, 2008, 92, 418). However, the major draw back is their low power conversion efficiencies (PCEs), which seriously hold back polymer solar cells to be further put into practical applications. Great efforts have been made from various aspects to improve the PCEs during recent years. For instance, nickel oxides and graphene oxides are introduced as candidates for the hole transport layer as well as to prevent electron leakage from the BHJ acceptor to the anode in place of the conventional poly(3,4-ethylenedioxythiophene) (PEDOT) layer. Light reflective material was deposited between the electrode and the photo active layer to drive internal quantum efficiency near quantitative. Slow growth, thermal annealing and mixed solvents are adopted for optimizing the bicontinuous interpenetrating network. In general, polymer's physical properties determine the open-circuit voltage ($V_{oc}$) and the short-circuit current density ($J_{sc}$), and the PCE is defined as $P_{out}/P_{in} = V_{oc} J_{sc} FF/P_{in}$. Thus, the research on developing novel semiconducting polymers has aimed at: 1) lowering the bandgap to enhance the $J_{sc}$; and 2) lowering the energy level of the highest occupied molecular orbital (HOMO) to improve the $V_{oc}$.

The recent surge of enthusiasm in bulk heterojunction (BHJ) organic photovoltaics (OPVs) is driven by their potential for fabricating flexible and light-weight solar cells via facile, low-cost solution processing techniques. (Thompson, B. C. et al. Angew. Chem., Int. Ed. 2008, 47, 58-77. Gunes, S. et al. Chem. Rev. 2007, 107, 1324-1338. Spangaard, H. et al. Sol. Energy Mater. Sol. Cells. 2004, 83, 125-146. Hoppe, H. et al. J. Mater. Res. 2004, 19, 1924-1945. Brabec, C. J. et al. Adv. Funct. Mater. 2001, 11, 15-26.) New materials are crucial in order for OPVs to fully mature from research and development into cost effective products. Power conversion efficiency (PCE) of large-area OPV solar cells should be continuously improved. (G. Dennler, G. et al. J. Adv. Mater. 2009, 21, 1323-1338. Scharber, M. et al. Adv. Mater. 2006, 18, 789-794. Coakley, K. M. et al. Chem. Mater. 2004, 16, 4533-4542.) One of the major challenges in design of new polymers is the simultaneous optimization of physical properties, such as morphology and donor-acceptor energy level matching. (Cheng, J.-Y. et al. Chem. Rev. 2009, 109, 5868-5923. Brabec, C. J. et al. J. Chem. Soc. Rev. 2011, 40, 1185-1199. Bundgaard, E. et al. Sol. Energy Mater. Sol. Cells. 2007, 91, 954-985.)

In addition to these parameters, when bandgap, energy levels and morphology were all optimized, the incorporation of a large local dipole moment can also play an important role in charge separation, enhancing the performance of the OPV cells. (Carsten, B. et al. J. Am. Chem. Soc. 2011, 133, 20468-20475.)

There is a need in the art for polymer solar cells that exhibit increased solar conversion efficiency.

BRIEF SUMMARY

Described herein are semiconducting photovoltaic derivatives, including polyselenophene derivatives, which exhibit high solar conversion efficiencies when used in electro-optical and electronic devices. There are also semiconducting polymers that are used as hole transporting material with fullerene derivatives as acceptors in electro-optical and electronic devices. The polymers are designed to achieve a low bandgap for broad absorption in the solar spectrum.

In one aspect, a semiconducting polymer has a formula selected from the group consisting of:

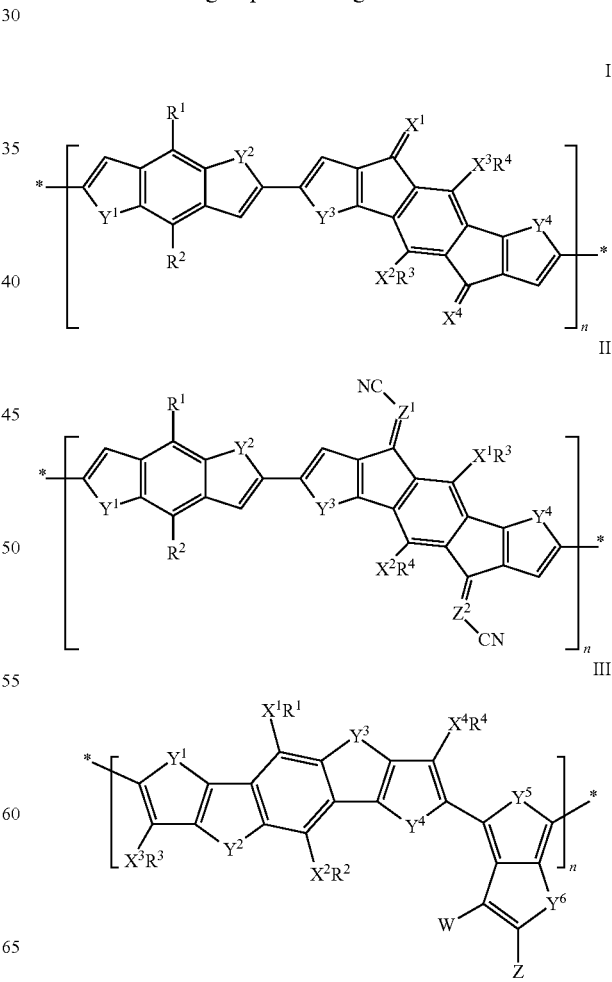

-continued

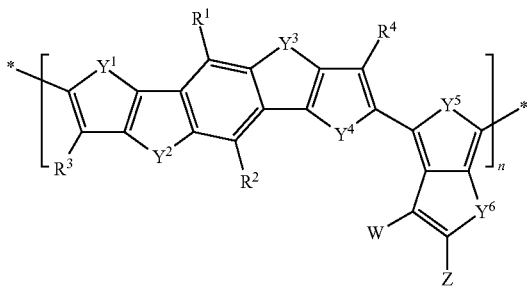

IV

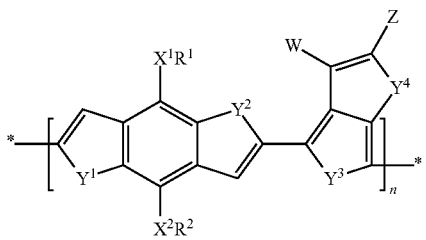

V

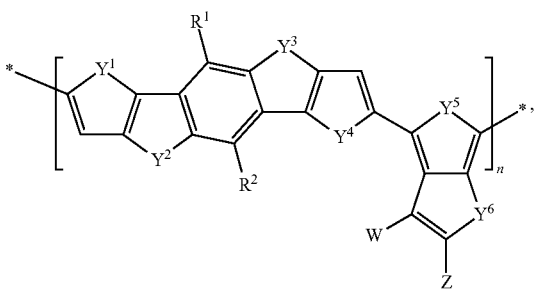

VI where $X^1$, $X^2$, $X^3$, and $X^4$ are independently selected from the group consisting of O, S, Se, NH, and $CH_2$. $R^1$, $R^2$, $R^3$, and $R^4$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, $Y^4$, $Y^5$, and $Y^6$ are independently selected from the group consisting of O, S, Se, and amino. Z is selected from the group consisting of an ester, ketone, amide, cyano, alkyl, polyfluoroalkyl, polychloroalkyl, aryl, and heteroaryl. $Z^1$ and $Z^2$ are independently selected from the group consisting of CH and N. W is selected from the group consisting of H, halogen, cyano, dicyanovinyl, and tricyanovinyl. n is an integer larger than 0.

In another aspect, a semiconducting polymer has a formula of any one of formulae I-VI with the substituents defined above.

DETAILED DESCRIPTION OF THE DRAWINGS AND THE PREFERRED EMBODIMENTS

Figure 1:
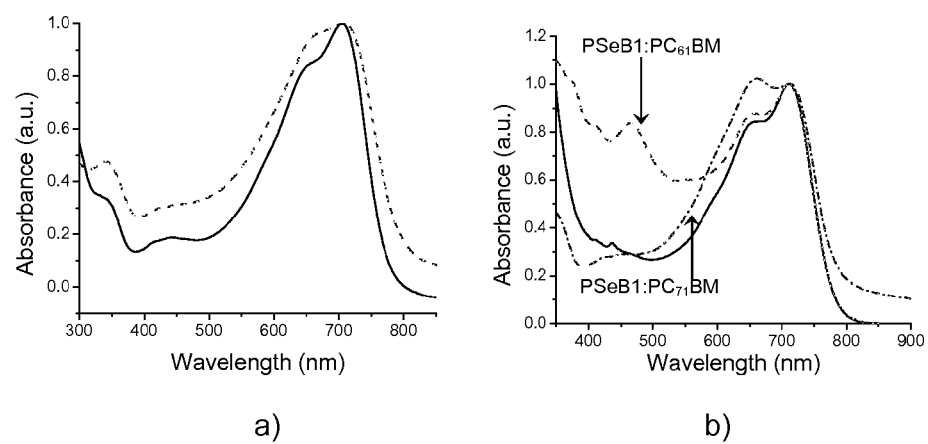
FIG. 1a shows UV-Vis spectra of PSeB1 (solid line) and PSeB2 (dashed line) in $CHCl_3$ solution.
FIG. 1b shows UV-Vis spectra of PSeB1:$PC_{61}$BM blend film (dashed line), PSeB1:$PC_{71}$BM blend film (dotted line), and PSeB2 (solid line).

Unless defined otherwise, all technical and scientific terms used herein have the same meaning as commonly understood to one of ordinary skill in the art to which this invention belongs. When describing the compounds, compositions, methods and processes of this invention, the following terms have the following meanings, unless otherwise indicated.

"Alkyl" by itself or as part of another substituent refers to a hydrocarbon group which may be linear, cyclic, or branched or a combination thereof having the number of carbon atoms designated (i.e., $C_{1-8}$ means one to eight carbon atoms). Examples of alkyl groups include methyl, ethyl, n-propyl, isopropyl, n-butyl, t-butyl, isobutyl, sec-butyl, cyclohexyl, cyclopentyl, (cyclohexyl)methyl, cyclopropylmethyl, bicyclo[2.2.1]heptane, bicyclo[2.2.2]octane, etc. Alkyl groups can be substituted or unsubstituted, unless otherwise indicated. Examples of substituted alkyl include haloalkyl, polyhaloalkyl, such as polyfluoroalkyl and polychloroalkyl, aminoalkyl, and the like. Alkyl groups also include straight-chained and branched alkyl.

"Alkoxy" refers to —O-alkyl. Examples of an alkoxy group include methoxy, ethoxy, n-propoxy, etc.

"Aryl" refers to a polyunsaturated, aromatic hydrocarbon group having a single ring (monocyclic) or multiple rings (bicyclic), which can be fused together or linked covalently. Aryl groups with 6-10 carbon atoms are preferred, where this number of carbon atoms can be designated by $C_{6-10}$, for example. Examples of aryl groups include phenyl and naphthalene-1-yl, naphthalene-2-yl, biphenyl and the like. Aryl groups can be substituted or unsubstituted, unless otherwise indicated. "Aryloxy" refers to —O-aryl; and "heteroaryloxy" refers to the group —O-heteroaryl.

The term "amino" refers to —NRR', where R and R' are independently selected from hydrogen, alkyl, aryl, aralkyl and alicyclic, all except hydrogen are optionally substituted. Both R and R' can form a cyclic ring system. The ring system may be from 5-7 members and may be optionally fused with another ring group including cycloalkyl, aryl, and heteroaryl.

"Cyano" refers to —CN.

"Ester" refers to R'C(=O)O—, where R' is a hydrogen atom, an alkyl group, an aryl group and an arylheterocyclic ring, as defined herein. "Arylheterocyclic ring" refers to a bi or tricyclic ring comprised of an aryl ring, as defined herein, appended via two adjacent carbon atoms of the aryl ring to a heterocyclic ring. Exemplary arylheterocyclic rings include dihydroindole, 1,2,3,4-tetrahydroquinoline, and the like.

"Ketone" refers to R'C(=O)—, where R' is a hydrogen atom, an alkyl group, an aryl group and an arylheterocyclic ring. For the purpose of definition only, ketone described herein includes aldehyde.

"Halo" or "halogen," by itself or as part of a substituent refers to a chlorine, bromine, iodine, or fluorine atom.

The term "heteroaryl," as used herein, refers to a mono-, bi-, or tri-cyclic aromatic radical or ring having from five to ten ring atoms of which at least one ring atom is selected from S, Se, O, and N; zero, one or two ring atoms are additional heteroatoms independently selected from S, Se, O, and N; and the remaining ring atoms are carbon, wherein any N or S contained within the ring may be optionally oxidized. Heteroaryl includes, but is not limited to, pyridinyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, benzimidazolyl, benzooxazolyl, quinoxalinyl, and the like. The heteroaromatic ring may be bonded to the chemical structure through a carbon or heteroatom.

"Heteroatom" is meant to include oxygen (O), nitrogen (N), sulfur (S), selenium (Se) and silicon (Si).

"Haloalkyl" as a substituted alkyl group refers to a mono-haloalkyl or polyhaloalkyl group, most typically substituted with from 1-3 halogen atoms. Examples include 1-chloroethyl, 3-bromopropyl, trifluoromethyl and the like.

The photovoltaic property of the polymers described herein was studied in polymer solar cells. Simple solar cells were used with semiconducting polymers of the formulas described herein. The power conversion efficiency (PCE) was greater than 6% in some embodiments. In embodiments that may be preferred, the semiconducting polymers yielded a PCE greater than 5%. The PCE reached 6.8% in some preferred embodiments.

The high conversion efficiency exhibited by the polymers described herein may be the result of an effective light harvest. The cells using the polymers absorb light in almost the entire visible spectrum. The polymer morphology also favors charge separation and charge transport. This can lead to high fill factors.

Without wishing to be bound by theory, the selenophene polymers described herein are based on the two main concepts. First, the donor moiety of the donor/acceptor type polymers, benzodiselenophene, which contains extended π-conjugation, will enhance the charge transfer in the polymer/fullerene blend films and facilitate the charge transport in heterojunction solar cell devices, due to the large Se electron orbitals.

Second, the acceptor moiety in a certain embodiment, selenoselenophene, can support a quinoidal structure and lead to a narrow polymer bandgap, which may have an effect on harvesting solar energy. Because the selenoselenophene moiety is electron-rich, an electron-withdrawing group, such as an ester group or a ketone, can be introduced to stabilize the resulting polymers.

In another aspect, the present disclosure also includes a ladder-type heteroacene as a building block of the polymers. Ladder-type heteroacenes have large effective conjugation lengths and are theoretically predicted to show narrower energy bandgaps relative to polyheteroaromatic compounds with an identical number of aromatic rings (Anthony, J. E. Angew. Chem. Int. Ed. 2008, 47, 452-483. Morales, Y. R. J. Phys. Chem. A 2002, 106, 11283-11308. Anthony, J. E. Chem. Rev. 2006, 106, 5028-5048).

Figure 4:
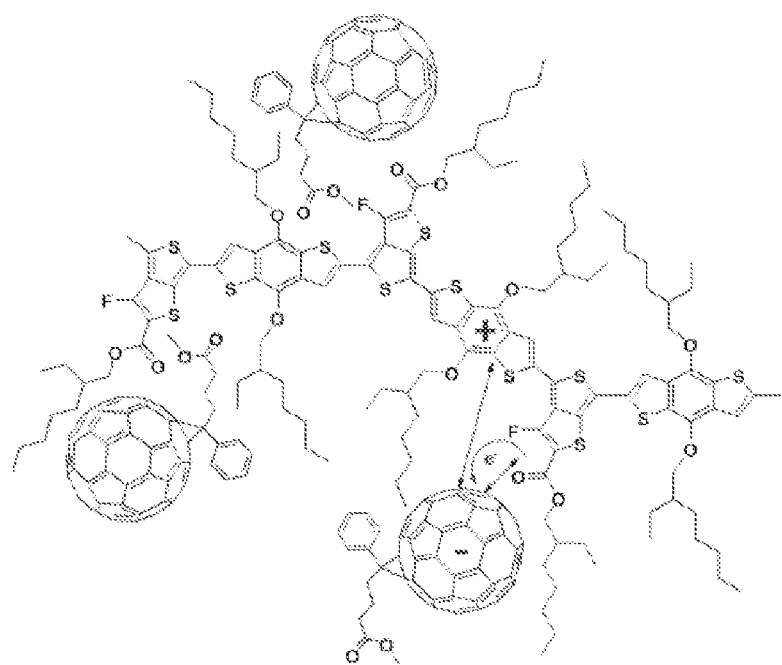
FIG. 4 shows a model explaining the dipolar effect in charge separation dynamics.

Without wishing to be bound by theory, as shown in the model (FIG. 4), upon photoexcitation, the large ground state local dipole moment in the polymer leads to the large local dipole change ($\Delta\mu_{ge}(D)$) in the polymer, thus, the excited state is largely polarized. The negative charge is concentrated on the electron-deficient thienothiophene moiety where charge transfer to PCBM will occur (curved arrow) while the positive charge remained on the benzo[1,2-b:4,5-b'] dithiophene unit (+). The large degree of separation between the negative and positive components lowers Coulomb binding energy of the exciton, making further charge separation/charge carrier transport easier. This leads to enhancement of the solar cell efficiencies.

This model indicates two approaches to enhance power conversion efficiency in new donor polymers: 1. further enhancing local dipole moment, 2. expanding the conjugation system in the BDT unit to enhance delocalization of positive charge, thus lowering charge density. New polymers are designed based on the second approach, which increase the extent of charge delocalization. A ladder-type heteroacene as the building block of the polymers was chosen. Ladder-type heteroacenes have large effective conjugation lengths and are predicted to show narrower energy bandgaps relative to polyheteroaromatic compounds with an identical number of aromatic rings. (Anthony, J. E. Angew. Chem. Int. Ed. 2008, 47, 452-483. Morales, Y. R. J. Phys. Chem. A 2002, 106, 11283-11308. Anthony, J. E. Chem. Rev. 2006, 106, 5028-5048.) Conjugated copolymers of a ladder-type heteroacene and 3-fluorothieno[3,4-b]thiophene-2-carboxylate may simultaneously result in a low bandgap of the copolymer and satisfy the design criteria mentioned above, leading to enhancement of the solar cell efficiencies.

Without wishing to be bound by any theory, several mechanisms have been postulated. Conjugated copolymers of a ladder-type heteroacene and 3-fluorothieno[3,4-b]thiophene-2-carboxylate may simultaneously result in a low bandgap of the copolymer, which will lead to enhancement of the solar cell efficiencies.

The semiconducting polymers described herein may be represented by formulae (I), (II), (III), (IV), (V) and (VI):

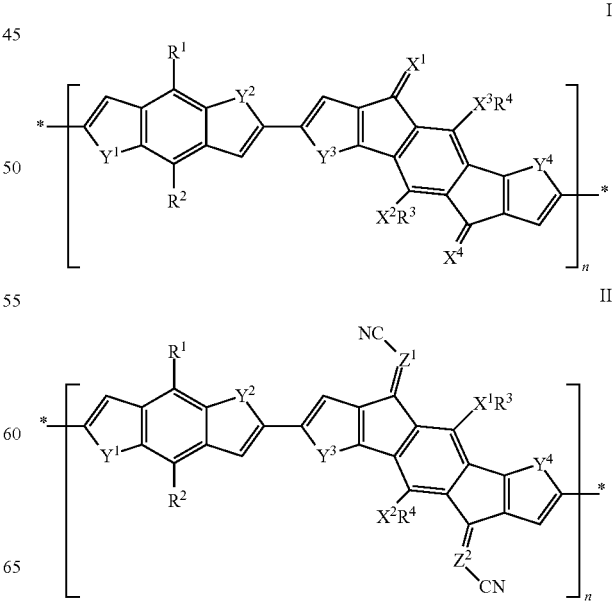

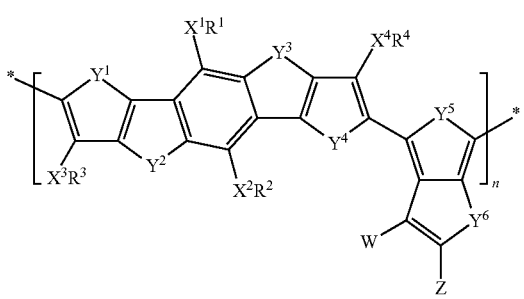

III

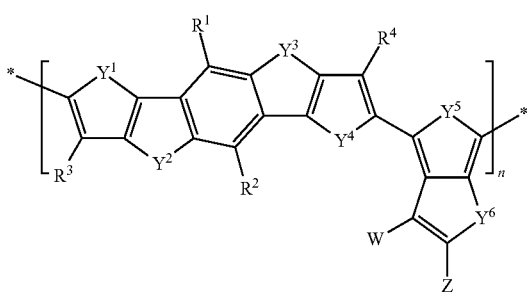

IV

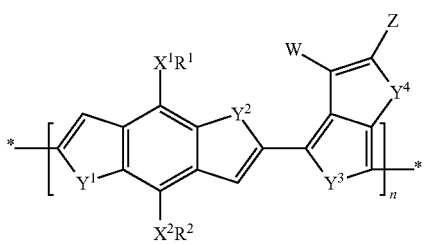

V

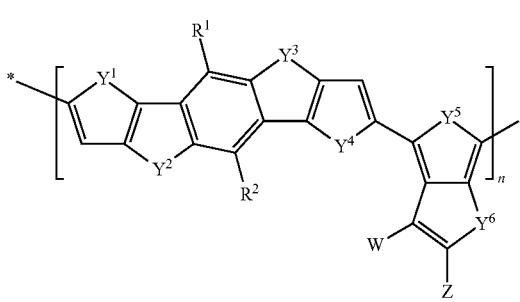

VI where $X^1$, $X^2$, $X^3$, and $X^4$ are independently selected from the group consisting of O, S, Se, NH, and $CH_2$. Preferably, $X^1$, $X^2$, $X^3$, and $X^4$ are independently selected from the group consisting of O, S, and NH. $R^1$, $R^2$, $R^3$, and $R^4$ are independently selected from H, alkyl, alkoxy, aryl, aryloxy, heteroaryl, heteroaryloxy, a cross-linkable moiety, and oligo (ethylene glycol). $Y^1$, $Y^2$, $Y^3$, $Y^4$, $Y^5$, and $Y^6$ are independently selected from O, S, Se, and amino. Z is selected from the group consisting of an ester, ketone, amide, cyano, alkyl, polyfluoroalkyl, polychloroalkyl, aryl, and heteroaryl. $Z^1$ and $Z^2$ are independently selected from CH and N. W is selected from the group consisting of H, halogen, cyano, dicyanovinyl, and tricyanovinyl. n is an integer larger than 0.

In some embodiments, the number-average molecular weight of the polymer is between about 15 and about 25 kDa. In some embodiments, n is from about 1 to about 200. In some embodiments, the polydispersity index is between about 1.5 and about 3.

In some embodiments, the semiconducting polymer has formula (V). $X^1$ and $X^2$ are independently selected from the group consisting of O, S, and NH. $R^1$ and $R^2$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, and $Y^4$ are independently selected from the group consisting of O, S, Se, and amino. Z is selected from the group consisting of ester, ketone, amide, cyano, alkyl, polyfluoroalkyl, polychloroalkyl, aryl, and heteroaryl. W is selected from the group consisting of H, halogen, cyano, dicyanovinyl, and tricyanovinyl. n is an integer larger than 0.

In some embodiments, the number-average molecular weight of the polymer is between about 15 and about 25 kDa. In some embodiments, n is from about 1 to about 200. In some embodiments, the polydispersity index is between about 1.5 and about 3.

In some embodiments, either $X^1$ and $X^2$ or both are O.

In some embodiments, $R^1$ and $R^2$ are independently alkyl. In some embodiments, $R^1$ and $R^2$ are independently $C_{1-30}$ alkyl group. In some embodiments, $R^1$ and $R^2$ are the same. In some embodiments, $R^1$ and $R^2$ are 2-ethylhexyl.

In some embodiments, $Y^1$ and $Y^2$ are S. In some embodiments, $Y^1$ and $Y^2$ are Se. In some embodiments, $Y^3$ and $Y^4$ are Se.

In some embodiments, Z is an ester. In some embodiments, Z is a $C_{1-30}$ alkyl ester. In some embodiments, Z is —C(O)OCH$_2$CH(C$_2$H$_5$)C$_4$H$_9$.

In some embodiments, W is H or halogen. In some embodiments, W is halogen. In some embodiments, W is F.

In some embodiments, the polymer is of formula (I):

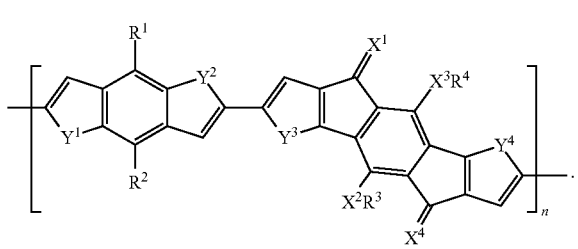

I

Preferably, $X^1$, $X^2$, $X^3$, and $X^4$ are independently selected from the group consisting of O, S, and NH. $R^1$, $R^2$, $R^3$, and $R^4$ are independently selected from the group consisting of H, alkyl, alkoxy, aryl, aryloxy, heteroaryl, heteroaryloxy, a cross-linkable moiety, and oligo (ethylene glycol). The cross-linkable group can be any group that links one group to another by covalent chemical bonds. $Y^1$, $Y^2$, $Y^3$, and $Y^4$ are independently selected from the group consisting of O, S, Se, and amino. n is an integer larger than 0.

In some embodiments, the polymer is of formula (II):

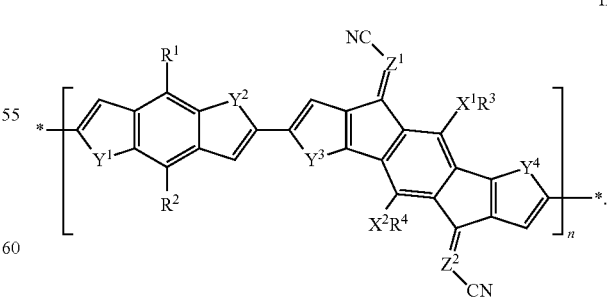

II

Preferably, $X^1$, and $X^2$ are independently selected from the group consisting of O, S, and NH. $R^1$, $R^2$, $R^3$, and $R^4$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, and $Y^4$ are independently selected from the group consisting of O, S, Se, and amino. $Z^1$ and $Z^2$ are independently selected from CH and N. n is an integer larger than 0.

In some embodiments, the polymer is of formula (III):

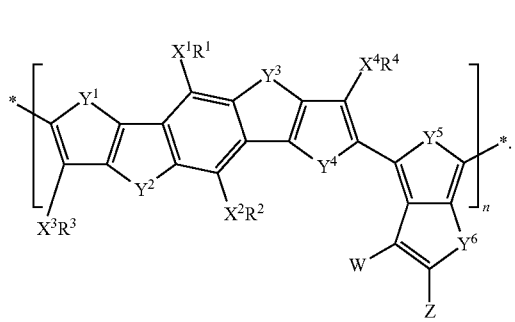

III

Preferably, $X^1$, $X^2$, $X^3$, and $X^4$ are independently selected from the group consisting of O, S, and NH. $R^1$, $R^2$, $R^3$, and $R^4$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, $Y^4$, $Y^5$, and $Y^6$ are independently selected from the group consisting of O, S, Se, and amino. Z is selected from an ester, ketone, amide, cyano, alkyl, polyfluoroalkyl, polychloroalkyl, aryl, and heteroaryl. W is selected from the group consisting of H, halogen, cyano, dicyanovinyl, and tricyanovinyl. n is an integer larger than 0.

In some embodiments, the polymer is of formula (IV):

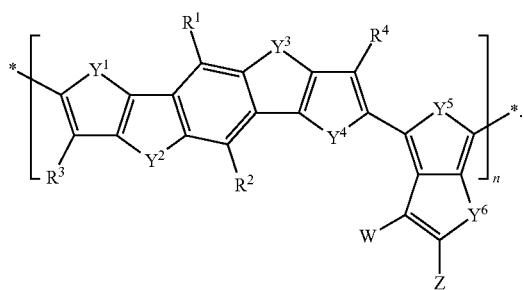

IV $R^1$, $R^2$, $R^3$, and $R^4$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, $Y^4$, $Y^5$, and $Y^6$ are independently selected from the group consisting of O, S, Se, and amino. Z is selected from an ester, ketone, amide, cyano, alkyl, polyfluoroalkyl, polychloroalkyl, aryl, and heteroaryl. W is selected from the group consisting of H, halogen, cyano, dicyanovinyl, and tricyanovinyl. n is an integer larger than 0.

In some embodiments, the polymer is of formula (V):

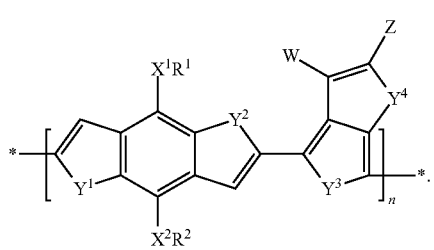

V

Preferably, $X^1$ and $X^2$ are independently selected from the group consisting of O, S, and NH. $R^1$ and $R^2$ are independently selected from the group consisting of H, alkyl, aryl, heteroaryl, a cross-linkable moiety, and oligo (ethylene glycol). $Y^1$, $Y^2$, $Y^3$, $Y^4$, $Y^5$, and $Y^6$ are independently selected from the group consisting of O, S, Se, and amino. W is selected from the group consisting of H, halogen, cyano, dicyanovinyl, and tricyanovinyl. n is an integer larger than 0.

Specific embodiments of the polymers of the present disclosure are shown below. $R^1$, $R^2$, and $R^3$ are independently selected from the group consisting of H, alkyl, alkoxy, aryl, aryloxy, heteroaryl, heteroaryloxy, a cross-linkable moiety, and oligo (ethylene glycol).

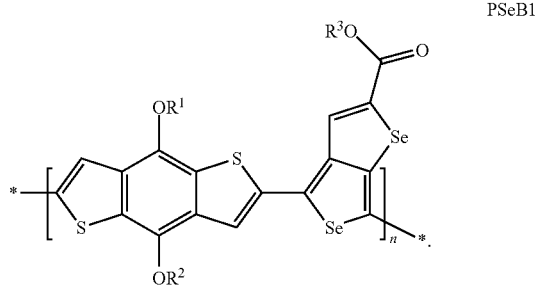

PSeB1

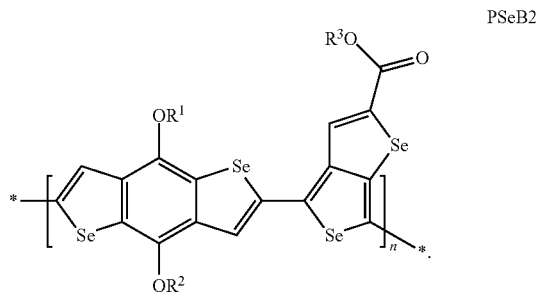

PSeB2

In some embodiments, $R^1$, $R^2$, and $R^3$ are independently alkyl. In some embodiments, $R^1$, $R^2$, and $R^3$ are independently $C_{1-30}$ alkyl group. In some embodiments, $R^1$, $R^2$, and $R^3$ are the same. In some embodiments, $R^1$, $R^2$, and $R^3$ are 2-ethylhexyl.

In certain embodiments, the electron-rich Se heteroatoms can have the effect of decreasing the bandgap of the polymer, allowing for more efficient light-harvesting. They can also increase the charge mobility. Several monomers with different side chains were thus synthesized in order to obtain processable polymers. At the same time, another thiophene PTB family polymer, PTB-8, with similar bulk side chains as those on PTAT-3, with two 2-butyloctyloxy on the benzodithiophene moiety, was also synthesized. (He, Feng; et al. *J. Am. Chem. Soc.* 2011, 133(10), 3284-3287.)

A ladder-type large acene, 3,7-dialkyl-dithieno[2,3-d:2',3'-d']benzo[1,2-b:4,5-b']dithiophene (DBD), was synthesized and incorporated into conjugated polymers.

A polymer has formula (VI):

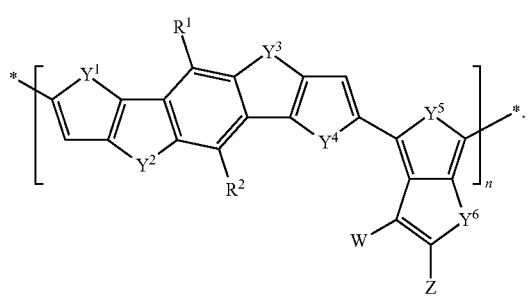

VI $R^1$ and $R^2$ are independently selected from the group consisting of H, alkyl, alkoxy, aryl, aryloxy, heteroaryl, heteroaryloxy, a cross-linkable moiety, and oligo (ethylene glycol). $Y^1$, $Y^2$, $Y^3$, $Y^4$, $Y^5$, and $Y^6$ are independently selected from the group consisting of O, S, Se, and amino. W is selected from the group consisting of H, halogen, cyano, dicyanovinyl, and tricyanovinyl. Z is selected from the group consisting of ester, ketone, amide, cyano, alkyl, polyfluoroalkyl, polychloroalkyl, aryl, and heteroaryl. n is an integer larger than 0.

In some embodiments, the number-average molecular weight of the polymer is between about 15 and about 25 kDa. In some embodiments, n is from about 1 to about 200. In some embodiments, the polydispersity index is between about 1.5 and about 3.

In some embodiments, $R^1$ and $R^2$ are independently $C_{1-30}$ alkyl. In some embodiments, $R^1$ and $R^2$ are independently 2-ethylhexyl or 2-butylhexyl.

In some embodiments, $Y^1$, $Y^2$, $Y^3$, $Y^4$, $Y^5$, and $Y^6$ are independently S.

In some embodiments, W is halogen. Preferably, W is F.

In some embodiments, Z is an ester. In some embodiments, Z is a $C_{1-30}$ alkyl ester. In some embodiments, Z is —C(O)OCH$_2$CH(C$_2$H$_5$)C$_4$H$_9$. In some embodiments, Z is —C(O)OCH$_2$CH(C$_4$H$_9$)C$_6$H$_{13}$.

The present disclosure also includes a use of a polymer described herein in a solar cell, an optical device, an electroluminescent device, a photovoltaic cell, semiconducting cell, or photodiode. In some embodiments, the polymer has a formula selected from formulae (I)-(VI).

In some embodiments, a composition comprises a semiconducting polymer described herein and an electron-withdrawing fullerene derivative. In some embodiments, the polymer has a formula selecting from formulae (I)-(VI). In some embodiments, the electron-withdrawing fullerene derivative can be [6,6]-phenyl-C$_{61}$-butyric acid methyl ester (PC$_{61}$BM) or [6,6]-phenyl-C$_{71}$-butyric acid methyl ester (PC$_{71}$BM). This composition can be used in a solar cell, an optical device, an electroluminescent device, a photovoltaic cell, semiconducting cell, or photodiode.

Figure 5:
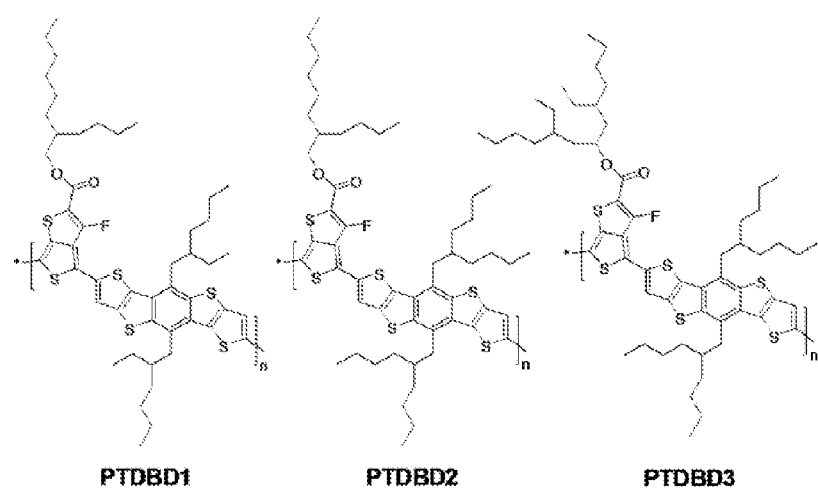
FIG. 5 shows the structures of PTDBD1-PTDBD3.

A new ladder-type large acene, 3,7-dialkyl-dithieno[2,3-d:2',3'-d]benzo[1,2-b:4,5-b']dithiophene (DBD), was successfully synthesized and incorporated into conjugated polymers, which exhibits an energy bandgap below 1.7 eV (FIG. 5). After optimization of the polymer's solubility and morphological compatibility with PC$_{71}$BM, the polymer BHJ solar cell devices achieved a PCE of 7.71%, which is among the best PCE reported for solar cell polymers.

Figure 6:
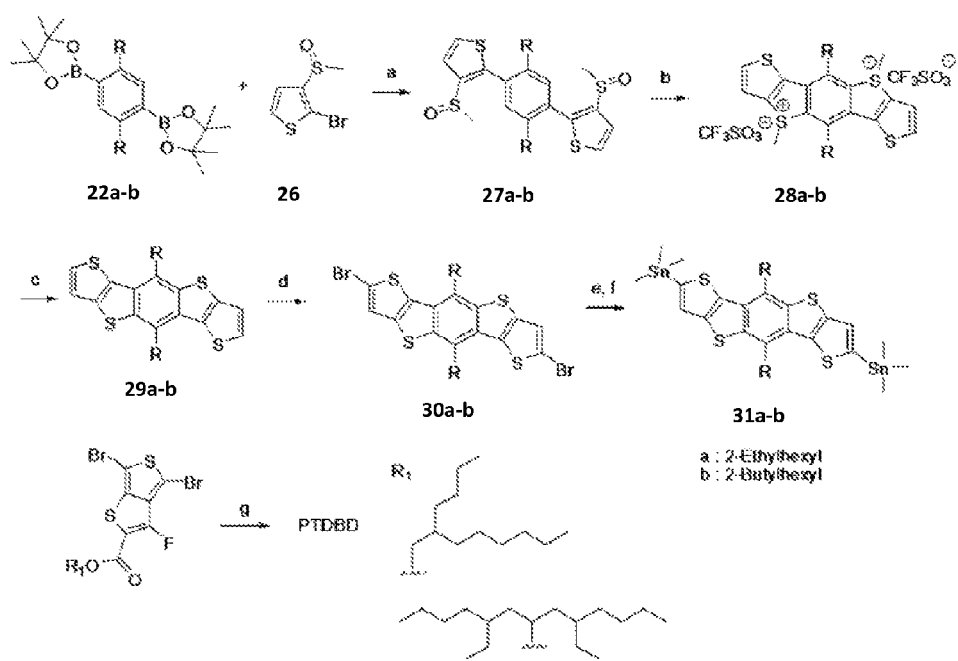
FIG. 6 shows the synthetic routes for the DBD monomer and PTDBD polymers, a) Pd(PPh$_3$)$_4$, K$_2$CO$_3$ (or NaOH), toluene/ethanol/H$_2$O, 110° C., 24 hours; b) CF$_3$SO$_3$H, P$_2$O$_5$, 3 days; c) pyridine, reflux, 12 hours; d) Br$_2$, CHCl$_3$, 6 hours; e) n-BuLi, THF, −78° C., 25 minutes; f) Me$_3$SnCl, −78° C., 12 hours; g) Pd(PPh$_3$)$_4$, toluene/DMF, 120° C., 12 hours.

The synthetic route to the DBD monomer is shown in FIG. 6. The synthesis of compounds 22a-b and 26 is as described herein. The DBD monomers are copolymerized with alkyl 4,6-Dibromo-3-fluorothieno[3,4-b]thiophene-2-carboxylate (FTT). (Carsten, B. et al. *P. Chem. Rev.* 2011, 111, 1493-1528.)

The initial polymer PTDBD1 (FIG. 5) shows low solubility and is difficult to process in organic solvents. To improve the solubility of the polymer, the polymer's structure is tuned by incorporating bulkier alkyl side chains either into the FTT, DBD units or both of these units. The resulting polymers PTDBD2 and PTDBD3 (FIG. 5) show similar weight-average molecular weights of 108.6 and 105.5 KDa, with polydispersity indices of 2.84, and 2.32, respectively. Thermogravimetric analyses (TGA) indicates that both polymers are stable up to about 250° C.

Figure 7:
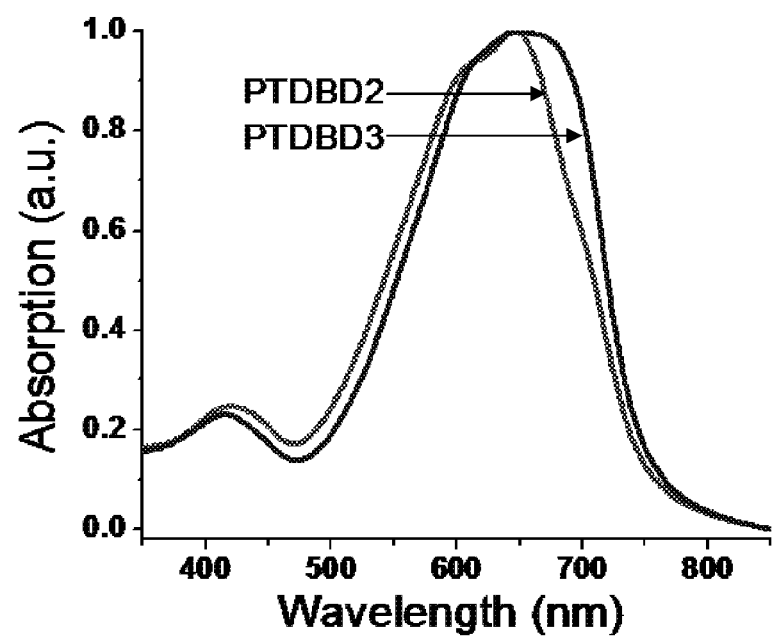
FIG. 7 shows the absorption spectra of the pristine polymer films.
Figure 9:
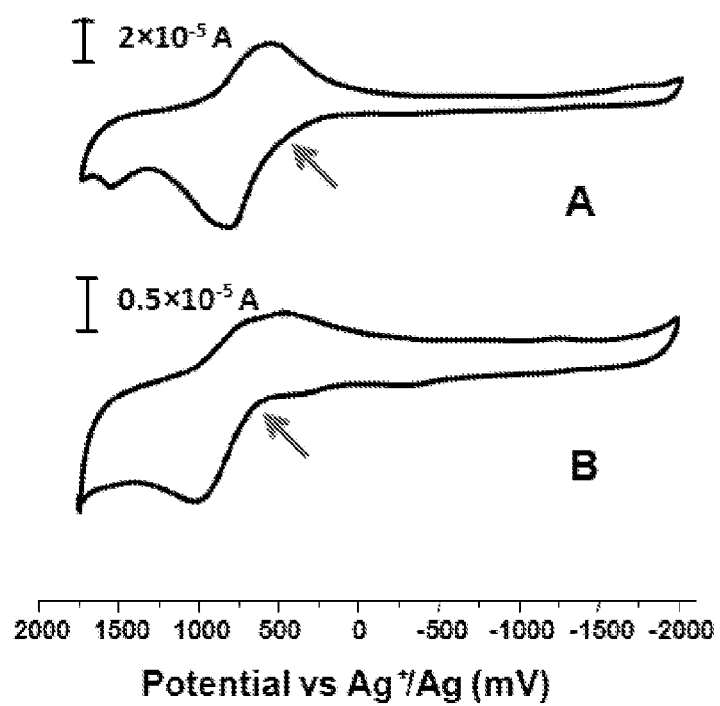
FIG. 9 shows cyclic voltammograms of PTDBD2 (A), and PTDBD3 (B).

PTDBD2 and PTDBD3 exhibit absorption from 450 nm to 800 nm in the polymer films, but the absorption of PTDBD3 is broader and more featureless (FIG. 7). The optical energy bandgaps of the polymers estimated from the onsets ($\lambda_{onset}$) of the absorption spectra are 1.67~1.68 eV. From cyclic voltammetry (CV) measurements in thin films, the HOMO energy level of PTDBD3 (−5.30 eV) is slightly lower than that of PTDBD2 (−5.24 eV) (FIG. 9). (Pommerehne, J. et al. *J. Adv. Mate.* 1995, 7, 551-554.) PTDBD2 shows a higher charge carrier mobility of $2.70 \times 10^{-4}$ cm$^2$V$^{-1}$s$^{-1}$ compared to $1.09 \times 10^{-4}$ cm$^2$V$^{-1}$s$^{-1}$ for PTDBD3, as determined by space-charge-limited current (SCLC) measurement for a pristine polymer film. Without being bound by theory, this is attributable to the large nonconductive bis(2-ethylhexyl)methyl group in the FTT of PTDBD3, which may disturb efficient charge carrier transport in the polymer film, although blending with fullerenes typically alters the polymer stacking morphology.

Figure 8:
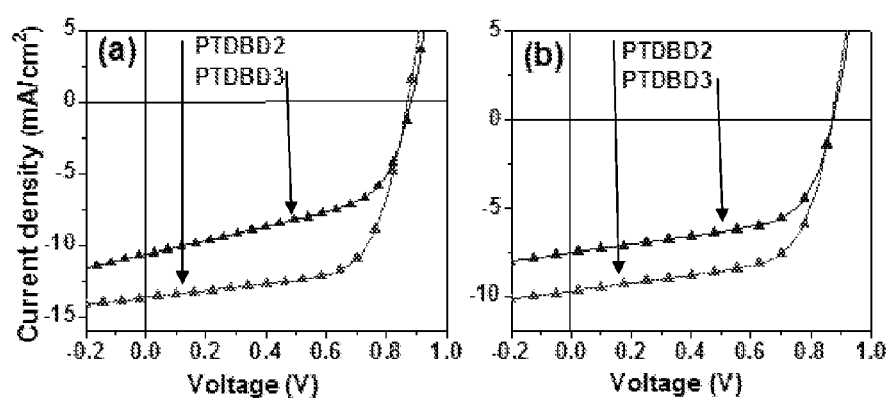
FIG. 8 shows the current-voltage plots of solar cells composed of polymer/PC$_{71}$BM (a) and polymer/PC$_{61}$BM (b).
Figure 10:
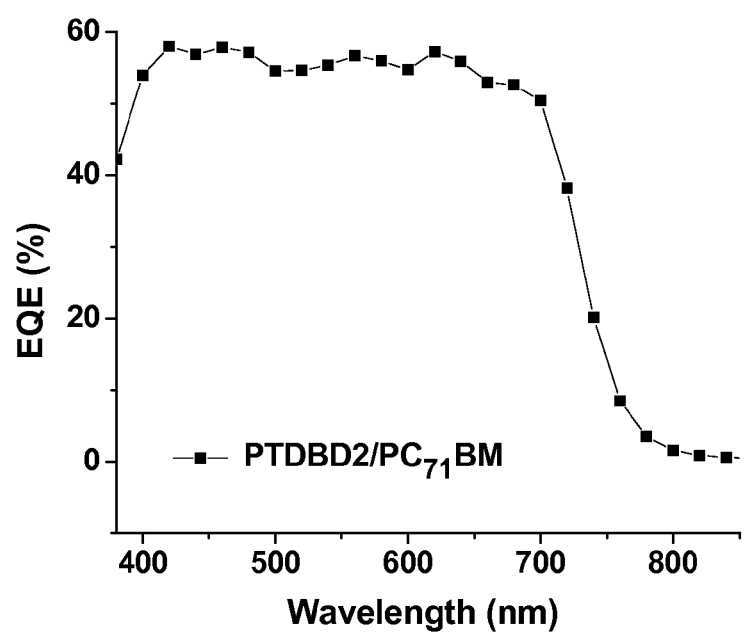
FIG. 10 shows an EQE curve of PTDBD2/PC$_{71}$BM solar cell device.

To characterize the photovoltaic properties for PTDBD2 and PTDBD3, the solar cell devices are prepared in the structure of (ITO/PEDOT:PSS/polymer:PCBMs/Ca/Al). The optimized polymer/PC$_{71}$BM ratios of PTDBD2, and PTDBD3 used to form the active layers of the polymer solar cells are 1:1.2 and 1:1.3, respectively. The same ratios are used for polymer/PC$_{61}$BM solar cells. The polymer active layers are spin-coated from solutions in a chlorobenzene (CB)/3% (v/v) 1,8-diiodooctane (DIO) co-solvent. The J-V curves are reported in FIG. 8, and the device performances are summarized in Table 1. Solar cells based on PTDBD2 exhibit the highest PCE of 7.71% when PC$_{71}$BM is used as an acceptor material. The external quantum efficiency (EQE) spectrum in FIG. 10 shows that the EQE of the PTDBD2/PC$_{71}$BM device is close to 60% in the 450 nm to 700 nm range. In the J-V curve of the device, the short circuit current density ($J_{sc}$) reaches up to 13.7 mA/cm$^2$, with an open circuit voltage ($V_{oc}$) of 869 mV and a fill factor (FF) of 64.8%. The solar cell device based on PTDBD3/PC$_{71}$BM, prepared using the same fabrication conditions except the PTDBD3/PCBM ratio, exhibits an improved $V_{oc}$ of 882 mV, without being bound by theory, perhaps owing to its lower HOMO value. However, PTDBD3 achieves a lower $J_{sc}$ of 10 mA/cm$^2$ which in combination with its FF value of 52.1%, results in PCE values of 4.92%. When the device is fabricated using PC$_{61}$BM, PTDBD2 also shows better solar cell performances with higher $J_{sc}$ and FF values. The improved photocurrents of PTDBD2 from PTDBD3 are, without being bound by theory, attributed to its higher charge carrier mobility.

TABLE 1

Performance of polymer solar cells of PTDBD2 and PTDBD3

| Polymer/PCBM (w/w) | $J_{sc}$ (mA/cm$^2$) | $V_{oc}$ (mV) | FF (%) | PCE (%) |
|---|---|---|---|---|
| PTDBD2/PC$_{71}$BM (1:1.2) | 13.7 | 869 | 64.8 | 7.71 |
| PTDBD3/PC$_{71}$BM (1:1.3) | 10.7 | 882 | 52.1 | 4.92 |
| PTDBD2/PC$_{61}$BM (1:1.2) | 9.72 | 869 | 63.0 | 5.32 |
| PTDBD3/PC$_{61}$BM (1:1.3) | 7.54 | 873 | 59.4 | 3.91 |

Transmission electron microscopy (TEM) studies indicated that the enhanced device performance of PTDBD2 over that of PTDBD3 may be related to changes in morphology of the polymer/PCBM blend films resulting from different alkyl side chains in the FTT unit of the polymer. PTDBD3 films blended with PC$_{71}$BM or PC$_{61}$BM exhibit larger and darker features with ~100 nm dimensions, indicative of aggregated PCBM clusters, whereas the blend films of PTDBD2 showed uniform and fine features roughly 10~15 nm in size. Smaller domains in devices are postulated to allow for a higher polymer-PCBM interface area and hence more efficient generation of charge carriers, resulting in higher photocurrents in PTDBD2 solar cells. Bulky side chains introduced to a conjugated polymer tend to reduce the miscibility of the polymers with PCBM molecules, leading to large phase separations between the polymers and the PCBM molecules. (He, F. et al. *J. Am. Chem. Soc.* 2011, 133, 3284-3287.)

Figure 11:
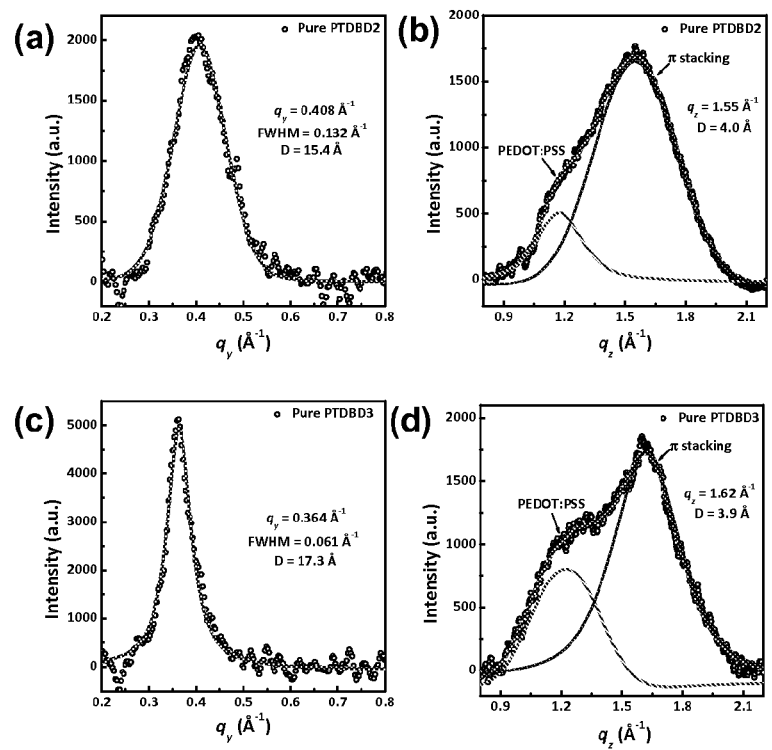
FIG. 11 shows the background-subtracted $q_y$ and $q_z$ line-cuts of 2D GIWAXS patterns of the neat PTDBD2 (a-b) and PTDBD3 (c-d) polymers on the Si substrate with a layer of PEDOT:PSS, which are present in FIG. 4 in the text. Here the solid lines represent the best fitting of the peaks using the Pseudo-Voigt type 1 peak function.

To gain more insight into the nanoscale morphology and molecular ordering in the blend films, grazing incidence wide angle x-ray scattering (GIWAXS) is applied to investigate these systems. The 2D GIWAXS patterns of neat PTDBD2 and PTDBD3 polymers exhibit a ring-like scattering at $q\sim0.35$-$0.45$ Å$^{-1}$, corresponding to the periodic lamellae of polymer backbones, and an out-of-plane scattering at around $q\sim1.6$ Å$^{-1}$, corresponding to the π-stacking of polymer backbones. For PTDBD2, the lamellar spacing is 15.4 Å ($q_y$=0.408 Å$^{-1}$) and the π-stacking distance is 4.0 Å ($q_z$=1.55 Å$^{-1}$). For PTDBD3, its lamellar spacing is 17.3 Å ($q_y$=0.364 Å$^{-1}$) and its π-stacking distance is 3.9 Å ($q_z$=1.62 Å$^{-1}$) (FIG. 11). The π-stacking scattering only observed out of plane suggests that the PTDBD2 and PTDBD3 polymer chains preferentially stack out of the film plane, though with a more random orientation.

Upon blending with PC$_{71}$BM, both PTDBD2 and PTDBD3 retain their structural characteristics, but the full width at half maximum (FWHM) of the peak associated with the backbone lamellae narrows from 0.132 Å$^{-1}$ to 0.110 Å$^{-1}$ for PTDBD2 and from 0.061 Å$^{-1}$ to 0.042 Å$^{-1}$ for PTDBD3, respectively. This indicates a higher degree of crystallinity in both polymers as a result of mixing with PC$_{71}$BM, which is beneficial for charge transport in the OPV devices. Besides the diffused scattering from either polymers or PC$_{71}$BM, a couple of sharp scattering spots attributed to well-defined, pure PC$_{71}$BM crystals are detected in the 2D GIWAXS patterns of polymer/PC$_{71}$BM blended films, demonstrating there are PC$_{71}$BM crystals floating in the polymer/PC$_{71}$BM blended phase. Since these scattering spots are rarely observed in the polymer/PC$_{61}$BM blends, without being bound by theory, it is possible that these floated PC$_{71}$BM crystals can drain photoexcited electrons out of the polymer/PC$_{71}$BM blended phase and transport them to the electrode, thereby promoting charge separation and transport. (Clarke, T. M. et al. *Chem. Rev.* 2010, 110, 6736. Deibel, C. et al. *J. IEEE J. Sel. Top. Quantum Electron.* 2010, 16, 1517.) In addition, since the FWHM of the polymer backbone peak of the PTDBD2/PC$_{71}$BM film is more than twice that of the PTDBD3/PC$_{71}$BM film, it suggests that the crystallinity of PTDBD2 is much lower. Such a low degree of crystallinity of PTDBD2 can lead to a better miscibility at a molecular level within the polymer/PC$_{71}$BM blended phase, which is confirmed by the TEM observations. Taken together, without being bound by theory, these structural and morphological features—the better miscibility of PTDBD2 with PCBM, the PCBM-induced crystallinity, and the floated well-defined, pure PCBM crystals—are responsible for the superior OPV performance of the PTDBD2 polymer when blended with PC$_{71}$BM.

A series of new semiconducting polymers containing ladder-type DBD derivatives are synthesized based on the idea of expanding the π-conjugation system to lower positive charge density and the binding energy. Optimal structures of side alkyl chains in the polymers improve the compatibility of the polymer chains with PCBM molecules, improving morphology of the polymer/PCBM blend film with concomitant enhancement in crystallinity of the polymer chains in the blend film. Consequently, the solar cell efficiency is enhanced up to 7.71%. This result indicates that the copolymers containing ladder-type DBD can comprise high performance organic solar cells.

Unless stated otherwise, all of the chemicals were purchased from Aldrich and used without further purification. All reactions were carried out under a nitrogen atmosphere unless otherwise noted. Tetrahydrofuran (THF) and diethyl ether (Et$_2$O) were distilled over sodium and benzophenone. Alkyl 4,6-dibromo-3-fluorothieno[3,4-b]thiophene-2-carboxylates were prepared according to the procedures reported in the literature. (Liang, Y. Y. et al. *J. Am. Chem. Soc.* 2009, 131, 7792-7799.) $^1$H NMR and $^{13}$C NMR spectra were recorded at either 400 or 500 MHz on Bruker DRX-400 or DRX-500 spectrometers respectively. Chemical shifts are reported in parts per million (ppm) from low to high frequency and referenced to the residual solvent resonance. Standard abbreviations indicating multiplicity were used as follows: s=singlet, d=doublet, t=triplet, m=multiplet, q=quartet, and b=broad. MALDI-TOF mass spectra were recorded on a Bruker Reflex II-TOF mass spectrometer using a 337 nm nitrogen laser with Tetracyanoquinodimethane (TCNQ) as matrix. EI mass spectrometry was performed with a Varian Saturn 2000 GC/MS mass spectrometer. Molecular weights and distributions of polymers were determined by using GPC with a Waters Associates liquid chromatography equipped with a Waters 510 HPLC pump, a Waters 410 differential refractometer, and a Waters 486 tunable absorbance detector. THF was used as the eluent and polystyrene as the standard. The optical absorption spectra were acquired using a Shimadzu UV-2401PC spectrophotometer. The thin films of the polymers were spin-coated from their solutions in chlorobenzene, and the film absorption spectra were measured.

The approach used for the synthesis of ethylhexyl 4,6-dibromoselenolo[3,4-b]thiophene carboxylate monomer 7 is based on a modified reported procedure (Scheme 1). Sodium selenide was prepared by slow addition of sodium borohydride to a mixture of selenium powder in a basic aqueous solution. The resulted colorless aqueous Na$_2$Se solution was added dropwise into an ethanolic solution of 2,3-bischloromethyl-5-carbomethoxyselenophene 1 over 30 minutes to produce the dimer of 2 in 73% yield as the only product. The structure was verified by $^1$H NMR and mass spectrum showed the exact molecular ion at 592 and the base peak at 296. The formation of 3 was not observed since the Na$_2$Se solution was added at a faster rate typical to these types of cyclizations. Following the reported procedure would lead to the formation of 2 as a major product (~70%) and 3 as a minor product (~10%). Since compound 3 is the key starting material, the need to improve its yield is required. Thus, several different experimental conditions were used including the use of NaHSe or Na$_2$Se in polar solvents (ethanol, water and THF), changing the mode of addition and the temperature at which reagents were added, the result is the formation of 2 as the sole product or as a major product and 3 as the minor one. It has been reported that the benzene analogue of dimer 2 can be converted into the corresponding dihydrobenzoselenophene thermally or photochemically in quantitative yields. This may be formed by favorable intramolecular cyclization of a biradical intermediate into two of the five-membered ring. Accordingly, flash pyrolysis of dimer 2 under reduced pressure was converted to dihydroselenoselenophene 3 in good yields (56%). The overall yield of the first two steps is 41% which is about four times the previously reported approach (10-12%). All spectroscopic data were in accordance with those for methyl 4,6-dihydroseleno[3,4-b]selenophene-2-carboxylate (3) reported. Aromatization of 3 by oxidation using H$_2$O$_2$ to give the N-selenoxide which upon careful treatment with cold acetic anhydride gave the corresponding methyl selenolo[3,4-b]thiophene carboxylate 4. Addition of acetic anhydride without cooling would lead to decomposition of some of the starting material due to instant spontaneous exothermic reaction that takes place. Bromination using NBS gave the methyl 4,6-dibromoselenolo[3,4-b]thiophene carboxylate 5 which upon hydrolysis under basic conditions yielded 4,6-dibromoselenolo[3,4-b]thiophene carboxylic acid 6. To enhance the solubility of the polymer, carboxylic acid 6 was esterified by the branched 2-ethyl-1-hexanol using DCC and DMAP to give the corresponding ethylhexyl 4,6-dibromoselenolo[3,4-b]thiophene carboxylate 7 monomer in high yield (88%).

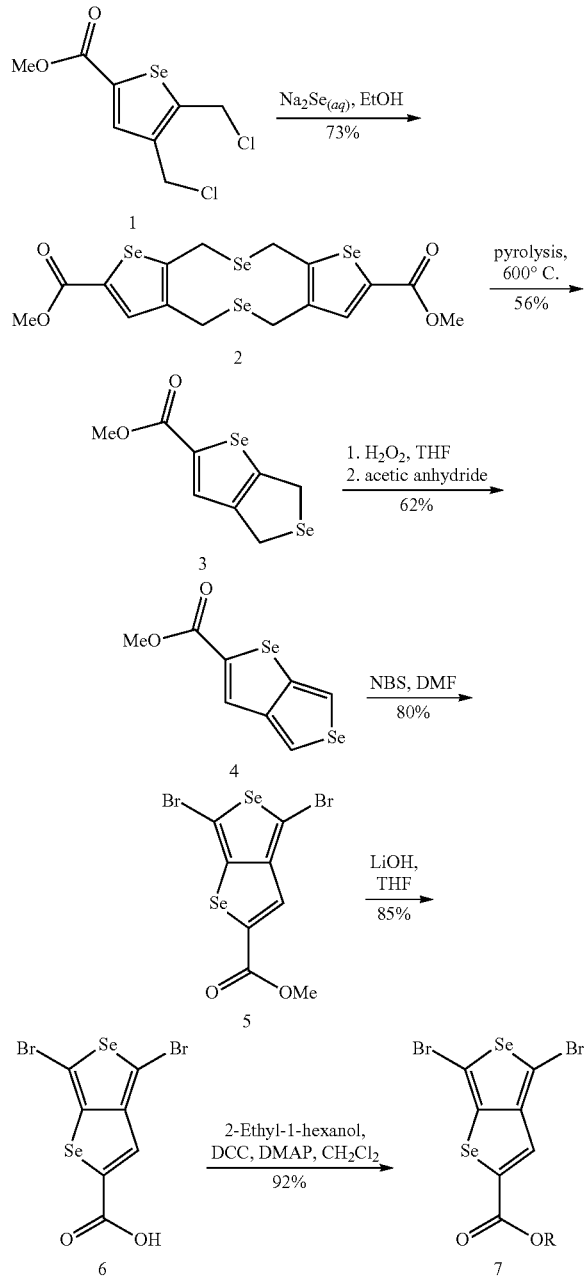

R=2-ethylhexyl

The convenient approach towards the synthesis of 4,8-bis(alkoxy)benzo[1,2-b:4,5-b']dithiophene (BDT) requires thiophene derivatives as key starting material (Yu et al. Science 1995, 270, 1789; Brabec et al. *Adv. Funct. Mater.* 2001, 11, 15; Shaheen et al. *Appl. Phys. Lett.* 2001, 78, 84; Li et al. *Nat. Mater.* 2005, 4, 864; Thompson et al. *Angew. Chem. Int. Edit.* 2008, 47, 58. Yu, G.; Heeger, A. J. *J. Appl. Phys.* 1995, 78, 4510). Since the availability of selenophene derivatives is limited, the synthetic approach where the central benzene is the starting material and the selenophene rings are constructed by intramolecular cyclization is followed. (Wang et al. *Appl. Phys. Lett.* 2008, 92, 33307; Peet et al. *Nat. Mater.* 2007, 6, 497; Muhlbacher et al. *Adv. Mater.* 2006, 18, 2884; Zou et al. *J. Am. Chem. Soc.* 2010, 132, 5330; Piliego et al. *J. Am. Chem. Soc.* 2010, 132, 7595).

To prepare 4,8-bis(alkoxy)benzo[1,2-b:4,5-b']diselenophene (BDSe) the central benzene should bear the alkoxy group in the early stages of the synthetic approach as shown in Scheme 2. Thus, the starting material towards the synthesis of 4,8-bis(2-ethylhexyl)benzo[1,2-b:4,5-b']diselenophene started from 1,4-dibromo-3,6-bis(2-ethylhexyl)benzene 9. Compound 9 was chlorinated using N-chlorosuccinamide (NCS) in the presence of $FeCl_3$ as a catalyst to give 1,4-dibromo-2,5-dichloro-3,6-bis(2-ethylhexyl)benzene 10 in a good yield (Liang et al. *J. Am. Chem. Soc.* 2009, 131, 56; Liang et al. *J. Am. Chem. Soc.* 2009, 131, 7792; Chen et al. *Nat. Photonic.* 2009, 3, 649; Liang et al. *Adv. Mater.* 2010, 22, E135; Liang et al. *Acc. Chem. Res.* 2010, 43, 1227). Reacting 10 with trimethysilylacetylene by palladium-catalyzed Sonogashira coupling gave 1,4-dibromo-2,5-bis(2-trimethylsilylacetylene)-3,6-bis(2-ethylhexyl)benzene 11 in moderate yields (45%). Upon treatment of compound 11 with t-butyl lithium followed by the addition of elemental selenium then quenched by ethanol gave the desired BDSe nucleus 12 in moderate yield (40%). This cyclization took place by the intramolecular cyclization reaction between the acetylene and the selenide anion intermediate (Wang et al. *Appl. Phys. Lett.* 2008, 92, 33307; Peet et al. *Nat. Mater.* 2007, 6, 497; Muhlbacher et al. Adv. Mater. 2006, 18, 2884; Zou et al. J. Am. Chem. Soc. 2010, 132, 5330; Piliego et al. *J. Am. Chem. Soc.* 2010, 132, 7595). The $^1H$ NMR of 12 showed the appearance of selenophene proton that resonates at 7.88 pm as the only singlet in the aromatic region. Compound 12 was desilyated by the treatment with tetrabutylammonium fluoride to give 13 in excellent yields (92%). Treatment of 13 with n- or t-butyl lithium yielded no apparent reaction even at extended times. To reach the desired monomer, 13 was preferably first brominated with NBS to yield 14, which would readily under lithium-halogen exchange with n-butyl lithium. Quenching with $SnMe_3Cl$ yielded the target 15. Polymerization of the monomers via Pd-catalyzed Stille polycondensation afforded polymers PSeB1 and PSeB2 in good yield.

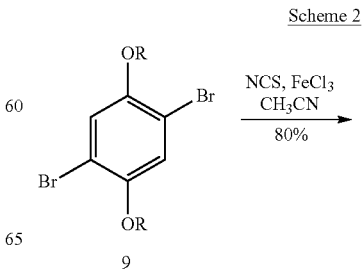

Scheme 2

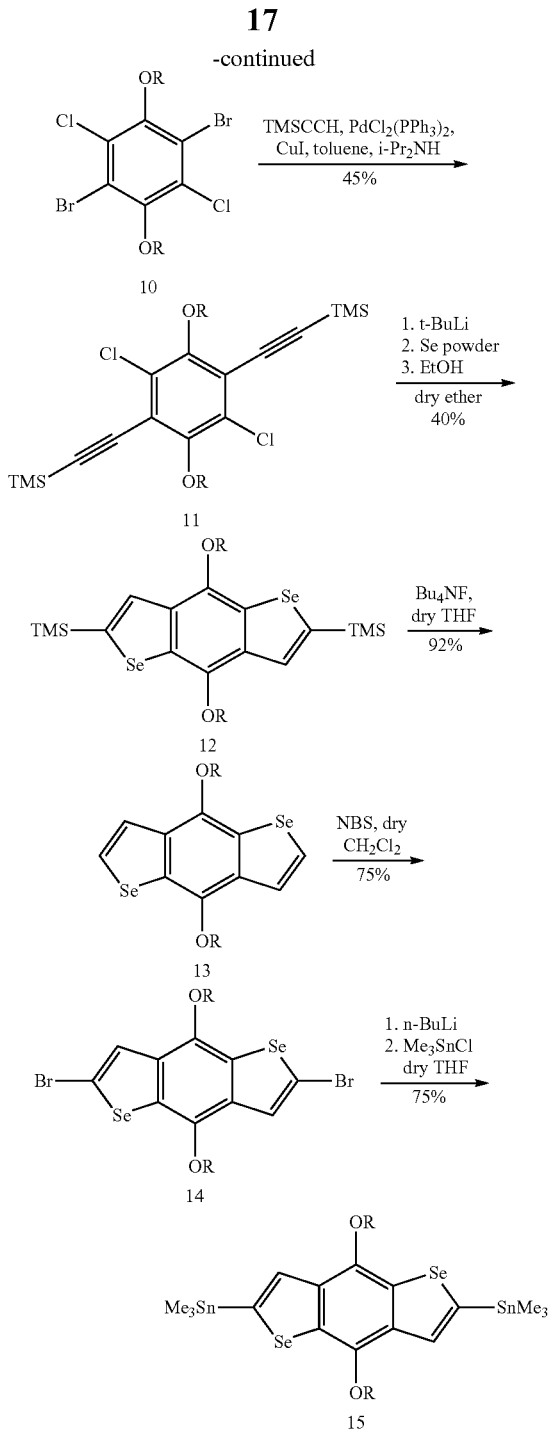

R=2-ethylhexyl

The number averaged molecular weight and the weight averaged molecular weight was characterized by gel permeation chromatography to be 9.2 kg/mol and 15.4 kg/mol with a polydispersity of 1.68 and 2.68, respectively. Thermal gravimetrical analysis (TGA) indicates that the polymer is stable up to 200° C. The presumption about the polymer bandgap was verified by the electronic absorption spectra. The UV-Vis spectra of PSeB1 and PSeB2 in a chloroform solution showed an absorption maximum at 703 and 707 nm, respectively (PTB1~692 nm). The solid polymer film absorption slightly red shifted to 713 nm for both polymers. Estimated from the spectrum onset, an optical band gap of 1.60 eV was obtained. The electrochemical behavior of PSeB1 thin film on a glassy carbon electrode is investigated by using cyclic voltammetry. As is shown in FIG. 1b, quasi-reversible characteristics are observed for the reduction and oxidation of both materials. The energy levels of frontier molecular orbitals can be deduced from the onset point using the equation of $E_{LUMO}=-(4.71+E_{red})$, $E_{HOMO}=-(4.71+E_{ox})$. The calculated LUMO and HOMO energy levels for PSeB1 are −3.27 eV and −5.05 eV, respectively, while those for PSeB2 are −3.26 eV and −5.04 eV, respectively. A band gap of 1.78 eV was obtained thereof for both polymers.

BHJ polymer solar cells are made with the device structures of ITO/PEDOT:PSS/polymer:fullerenes/Ca/Al. The active layer was spun-casted by using the weight ratio of 1:1 and 1:1.2 for polymer to $PC_{61}BM$ and $PC_{71}BM$ respectively. Film thickness is in the range of 100~110 nm.

Figure 2:
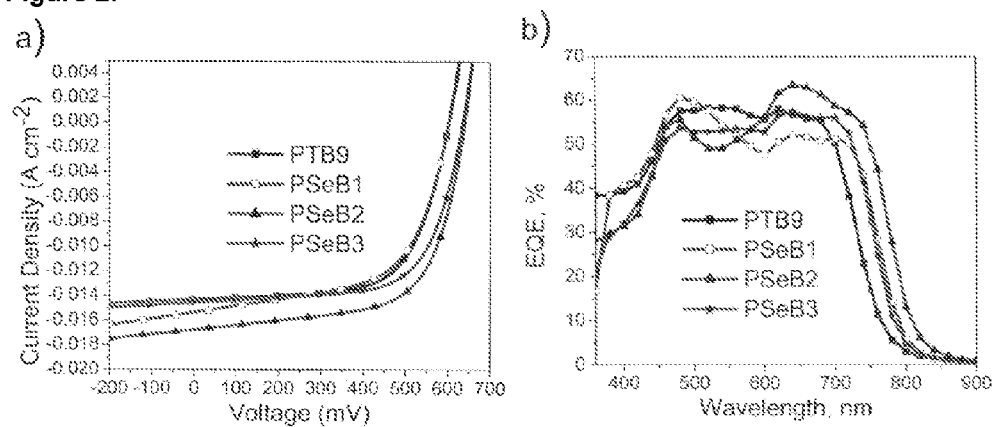
FIG. 2 shows (a) Current-voltage characteristics of polymer solar cells under AM 1.5 G condition (100 mW cm-2). (b) External quantum efficiency (EQE) of polymer solar cells (PTB9, dark square; PSeB1, square; PSeB2, triangle; PSeB3, star).
Figure 3:
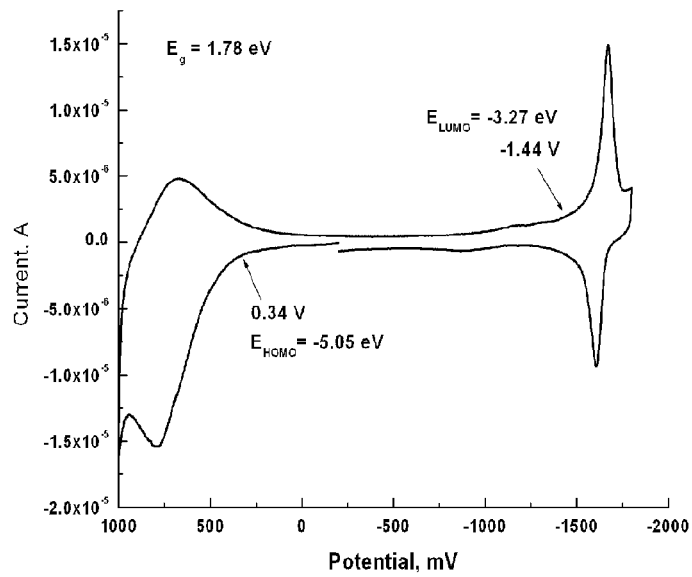
FIG. 3 shows a graph of cyclic voltammetry of PSeB1.
Figure 3:
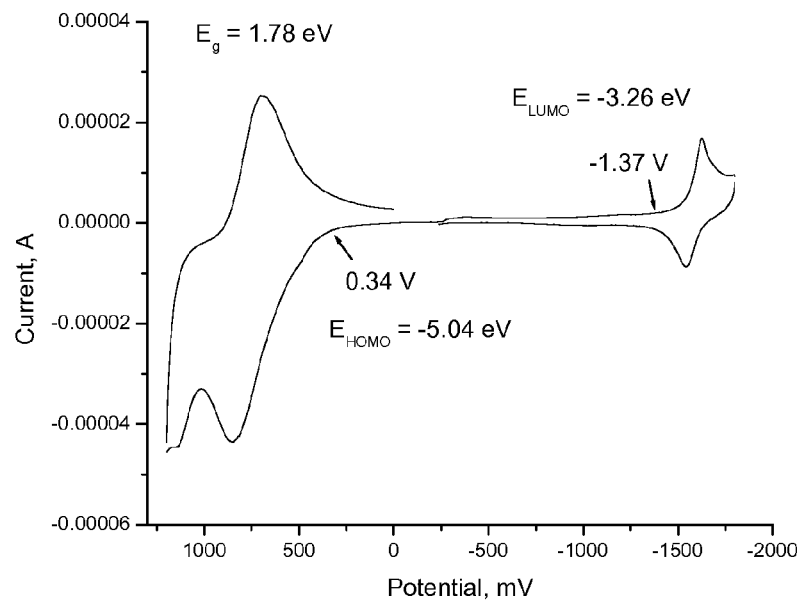

FIG. 2 shows the plot of the photo current density vs voltage recorded under 1.5 G irradiation at different solvent processing conditions for PSeB1. The corresponding physical parameters are collected in Table 2. The blend films of PSeB1/$PC_{61}BM$ prepared from the solvent of chlorobenzene (CB) and o-dichlorobenzene (DCB) are investigated. Both of the $V_{oc}$ and $J_{sc}$ obtained using CB are much higher than that obtained with DCB, indicating CB is a better solvent for this system. Addition of 1,8-diiodoctane (DIO, 2% v/v) into CB and DCB effectively enhanced the fill factor (FF) from ~41% to ~54% and leads to a high PCE of 5.33% (Entry 4). DIO does not have obvious effects on changing the $V_{oc}$ (Entry 3, 4: 626 to 624 mV) and the $J_{sc}$ (15.21 to 15.89 mA/cm²). It is worth of noting that the $J_{sc}$ of 15.89 mA/cm² is clearly among the best of the polymer solar cells. Since $PC_{71}BM$ has better absorption in the visible region while maintaining similar electronic properties as $PC_{61}BM$, the active layer was prepared by using the weight ration of PSeB1:$PC_{71}BM$ at 1:1.2. The film thickness is also around 100-110 nm. A surprisingly high $J_{sc}$ of 16.77 mA/cm² was obtained. The device has a $V_{oc}$ of 618 mV, a FF of 55%, and a PCE of 5.70%.

TABLE 2

Solar cell parameters of devices with PSeB1 and PSeB2.

| Entry | Solvent | $V_{oc}$ (mV) | $J_{sc}$ (mA/cm²) | FF | PCE (%) |
|---|---|---|---|---|---|
| 1[a] | DCB | 483 | 11.34 | 0.41 | 2.25 |
| 2[a] | DCB/DIO | 521 | 11.9 | 0.53 | 3.26 |
| 3[a] | CB | 626 | 15.21 | 0.43 | 4.11 |
| 4[a] | CB/DIO | 624 | 15.89 | 0.54 | 5.33 |
| 5[b] | CB/DIO | 618 | 16.77 | 0.55 | 5.70 |
| 6[c] | CB/DIO | 621 | 15.7 | 0.67 | 6.56 |
| 7[c] | DCB/DIO | 628 | 13.3 | 0.58 | 4.82 |

[a]1:1 PSeB1/$PC_{61}BM$.
[b]1:1.2 PSeB1/$PC_{71}BM$.
[c]1:1.2 PSeB2/$PC_{71}BM$.

Similarly to PSeB1, BHJ solar cells with PSeB2 cast in CB had superior performance compared to those from DCB. Using DCB with DIO as an additive led to a $V_{oc}$ of 628 mV, a $J_{sc}$ of 13.3 mA/cm², a FF of 58%, and a PCE of 4.82%. When DCB was replaced with CB, $J_{sc}$ increased to 15.7 mA/cm², similar to the increase found in PSeB1. However, the FF increased to 67%, while the $V_{oc}$ remained relatively unchanged. This is in stark contrast with PSeB1, which exhibited an increase in $V_{oc}$ and $J_{sc}$ with a static FF when switching from DCB to CB. Under these optimum conditions PSeB2 provided a PCE of 6.56%, which is considerably higher than the 5.70% exhibited by PSeB1.

The EQE for both PSeB1 and PSeB2 under optimized conditions was measured and found to be nearly identical (FIG. 2b). Both span a wide range of wavelengths (350-800 nm) with a maximum at 645 nm. The maximum EQE for both polymers is 63% and 61% for PSeB1 and PSeB2, respectively. The trace for PSeB2 is slightly red-shifted compared to that of PSeB1, which is due to PSeB2's absorbance being red-shifted (FIG. 1). This enables PSeB2 to harvest a broader span of energy compared to PSeB1.

Transmission electron microscopy (TEM) was performed to study the blend films. The PSeB1/PC$_{71}$BM film cast from CB without the DIO additive exhibited a coarse morphology, indicating the formation of large separate domains of aggregated polymer and fullerene. PSeB1/PC$_{71}$BM films cast from CB/DIO exhibited uniform and fine features, indicating nanoscale phase separation and results with an effective donor-acceptor interaction. This characteristic feature facilitates the charge separation. The hole mobility of PSeB1 was determined by using space charge limited current (SCLC) method, which was found to be ~2.9×10$^{-4}$ cm$^2$/V$^-$ s. This value falls in the same level of previously described PTB polymers and is sufficient to form balanced carrier mobility in the blend and lead to a high fill factor. The PSeB2/PC$_{71}$BM films cast from CB/DIO show a surprisingly coarse morphology, despite being structurally similar to PSeB1. Indeed, its morphology is closer to that of the PSeB1/PC$_{71}$BM film cast from CB without the DIO additive. However, the PSeB2/PC$_{71}$BM films cast from CB/DIO exhibit an extremely high PCE, which is in stark contrast to observations of the thiophene PTB series of polymers.

In the present invention, semiconducting polymers, polyselenopheno[3,4-b]selenophene-co-benzodithiophene (PSeB1) and polyselenopheno[3,4-b]selenophene-co-benzodiselenophene (PSeB2), were synthesized. The photovoltaic study indicates that the PSeB2 is a very promising material for the applications as BHJ solar cells. An excellent PCE of 6.56% was achieved when blended with PC$_{71}$BM. However, AFM studies revealed a poor film morphology, indicating that even higher PCE's are possible with this polymer.

In this disclosure, selenoselenophene monomers were selectively fluorinated to enhance PCE. This system uses fluorine substitution to enhance PCE. It has been shown that fluorination of the thienothiophene has an effect on PCE. Synthesis of fluorinated selenophene polymers is shown in Scheme 3.

Scheme 3

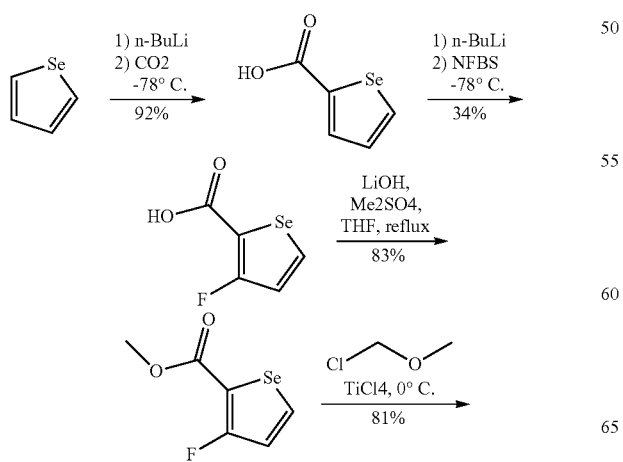

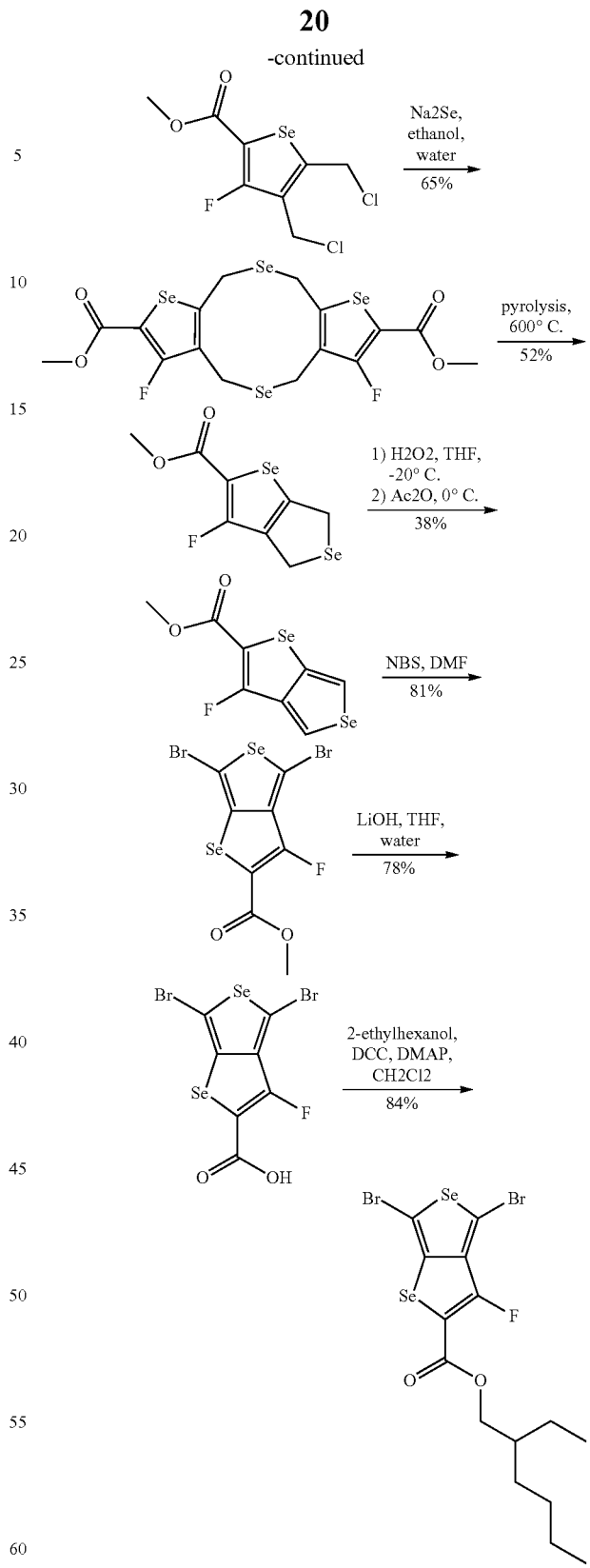

The present invention also includes compositions of the semiconducting polymers and electron accepting materials including, but not limited to, Buckminsterfullerene ("fullerene") derivatives. Any electron accepting fullerene can be used with the semiconducting polymers described herein. Such fullerenes can be from C60 to C90. In preferred embodiments the fullerene can be C61, C71, C81, or C91. The fullerene can be [6,6]-phenyl-C61-butyric acid methyl ester (PC61BM), having the following formula:

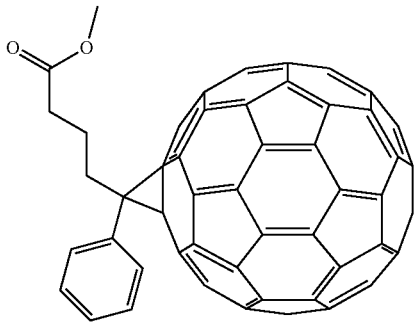

The polymer and fullerene can blend as a mixture. In one embodiment, the conjugates can be joined with the fullerenes as shown below.

One embodiment of the present disclosure includes the use of the semiconducting polymers and the conjugates described herein in devices such as a solar cell, an optical device, an electroluminescent device, a photovoltaic cell, semiconducting cell, or photodiode. Another embodiment of the present disclosure includes the use of the conjugates of the semiconducting polymers described herein in a solar cell, an optical device, an electroluminescent device, a photovoltaic cell, semiconducting cell, photodiode or polymeric field effect transistors.

A method of incorporating the semiconducting polymers described herein onto a substrate comprises dissolving one or more of the polymers described herein with a fullerene derivative in a solvent and applying the resulting composite onto a substrate.

The one or more of the polymers can be co-dissolved with a fullerene derivative in, for example, 1,2-dichlorobenzene, chlorobenzene, chloroform, or toluene. Polymers can be in concentrations in a range of about 5 to about 20 mg/mL or any combination or subcombination therein.

The polymer/fullerene composite can then be applied onto a substrate. Suitable substrates such as Indium Tin Oxide (ITO)-coated glass that are known in the art can be used. The composite can be applied onto the substrate using any variety of processes suitable for layer application or casting. Spin casting can be used to apply a thin layer or film of the composite blend onto a substrate. The layer of composite blend can be from about 80 nm to about 150 nm thick. Layer thickness will vary depending on the application of the composite blend and the substrate. Therefore, provided herein is a photovoltaic film comprising a semiconducting polymer as described herein with a fullerene derivative.

Semiconducting polymers described herein can have alternating tetrathienoanthracene and thieno[3,4-b]thiophene units. The physical properties of these polymers can be finely tuned for photovoltaic application. The HOMO energy levels of the polymer can be lowered by substituting alkoxy side chains to the less electron donating alkyl chains or introducing electron withdrawing fluorine into the polymer backbone, leading to an increase in Voc for polymer solar cells. The side chains and substitute groups also affect the polymers' absorption and hole mobility, as well as the miscibility with fullerene, all influencing polymer solar cell performances. Films prepared from mixed solvent exhibit a finely distributed polymer/fullerene interpenetrating network and significantly enhanced solar cell conversion efficiency. A power conversion efficiency over 5.6% can be achieved in solar cells based on fluorinated PTAT-3/$PC_{61}BM$ composite films prepared from mixed solvents.

Throughout this specification, various indications have been given as to preferred and alternative embodiments of the invention. However, it should be understood that the invention is not limited to any one of these. It is therefore intended that the foregoing detailed description be regarded as illustrative rather than limiting, and that it be understood that it is the appended claims, including all equivalents, that are intended to define the spirit and scope of this invention.

EXAMPLES

Dimer (2).

Selenium metal (1.65 g, 21.0 mmol) was suspended into a solution of sodium hydroxide (1.93 g, 48.3 mmol) in 60 mL of water. Sodium borohydride (1.79 g, 48.3 mmol) was dissolved in 20 mL of water and added slowly to the selenium suspension under nitrogen atmosphere. The reaction was exothermic with vigorous evolution of hydrogen gas. The resulted mixture was further stirred for 4 hours at room temperature. The colorless solution of sodium selenide was added dropwise into a solution of methyl 2,3-bischloromethylselenophene-5-carboxylate 1 (5.00 g, 17.4 mmol) in 200 mL degassed ethanol. After the addition completed the resulted mixture was further stirred for 2 hours. The solvent was removed and the solid residue was stirred with 100 mL of water for 30 minutes. Then the mixture was filtered to give 2 (3.76 g, 73%) pure enough for the next step. A pure sample was obtained by recrystallization from pyridine/water. $^1$H NMR ($CDCl_3$): δ 3.27 (4H, s), 3.78 (4H, s), 3.85 (6H, s), 8.05 (2H, s). MS (EI): Calculated, 591.8. found $[M+1]^+$, 592.8.

Methyl 4,6-Dihydroseleno[3,4-b]selenophene-2-carboxylate (3): A Pyrex tube closed at one end (40 cm long and 2 cm in diameter) was used for pyrolysis. A sample of 2 (0.25 g, 0.425 mmol) was placed in the closed end of the tube. The open end was connected to a vacuum system. The closed end with the sample was placed into an electric furnace (preheated at ~600° C.). The pyrolysis immediately (ca. 2 minutes) occurred and compound 3 condensed on the cold part of the glass tube (outside the furnace). The organic products were dissolved in $CH_2Cl_2$, concentrated and chromatographed on silica gel using $CH_2Cl_2$/hexane=1:1 yielded the pure 3 as yellow solid 0.14 g (56%). $^1$HNMR ($CDCl_3$): δ 3.85 (3H, s), 4.08 (2H, m), 4.29 (2H, m), 7.73 (1H, s). MS (EI): Calculated, 295.9. found $[M+I]^+$, 296.7.

Methyl seleno[3,4-b]selenophene-2-carboxylate (4): To a solution of 0.90 g (3.06 mmol) of 3 in 7 mL dry THF cooled at −20° C. was added a solution of 0.62 g (5.3 mmol) 30% $H_2O_2$ in 3 mL dry THF dropwise with stirring. After stirring overnight at −20° C., the colorless solid was filtered off giving 0.66 g of the selenoxide. The filtrate was concentrated in vacuo and filtered to give an additional 0.12 g of the selenoxide, (81%). The selenoxide was treated with cold $Ac_2O$ (15 mL), whereupon a spontaneous exothermic reaction took place and the solution became very dark. After stirring at room temperature for 1 hour, the $Ac_2O$ was hydrolyzed with water, the mixture was extracted with $CH_2Cl_2$ and the organic extracts were washed carefully with cold saturated $NaHCO_3$ and water, dried over $MgSO_4$ and concentrated. Column chromatography on silica gel using $CH_2Cl_2$ gave 0.55 g of 4 (62%). $^1$H NMR ($CDCl_3$): δ 3.90 (3H, s), 7.83 (1H, s), 7.95 (1H, dd, J=2.3, 0.85 Hz), 8.44 (1H, d, J=2.4 Hz). MS (EI): Calculated, 293.9. found [M+I], 294.9.

Methyl 4,6-dibromoseleno[3,4-b]selenophene-2-carboxylate (5): To a solution of 0.34 g (6.0 mmol) of 4 in 3 mL DMF was added dropwise a solution of NBS (0.52 g, 15.0 mmol) in 3 mL DMF under nitrogen protection at dark and stirred for 24 hours. The reaction mixture was poured into saturated sodium sulfite solution at ice-water bath, and extracted with dichloromethane. The organic phase was collected and dried by sodium sulfate. Removal of the solvent, and column purification on silica get using dichloromethane/hexane (1:1) yielded the title compound 5 as light yellow solid 0.42 g (80%). $^1$H NMR (CDCl$_3$): δ 3.90 (3H, s), 7.75 (1H, s). MS (EI): Calculated, 449.7. found [M+I]$^+$, 450.7.

4,6-dibromoseleno[3,4-b]selenophene-2-carboxylic acid (6): To a solution of 0.41 g (0.91 mmol) of 5 in 15 mL THF was added a solution of LiOH.H$_2$O (0.12 g, 2.86 mmol) in 3 mL H$_2$O. The resulted mixture was stirred at room temperature under N$_2$ for 4 hours then poured into ice H$_2$O followed by acidification in 1 N HCl solution. The yellow solid was filtered, washed with cold water then dried to give 0.34 g of 6 (85%). $^1$H NMR (DMSO): δ 7.65 (1H, s), 13.80 (IH, s). MS (EI): Calculated, 435.7. found [M−I]$^+$, 434.7.

2-Ethylhexyl 4,6-dibromoseleno[3,4-b]selenophene-2-carboxylate (7): 0.34 g (0.78 mmol) of 6, 0.21 g (1.02 mmol) DCC, 20 mg (0.16 mmol) DMAP were added to a 10 mL round bottom flask with 5 mL CH$_2$Cl$_2$. 0.75 g (10.0 mmol) of 2-ethylhexan-1-ol was added to the flask and then kept stirring for 20 hours under N$_2$ protection. The reaction mixture was poured to 30 mL water and extracted with CH$_2$Cl$_2$. The reaction mixture was directly chromatographed on silica gel using hexane/CH$_2$Cl$_2$=5:1 yielded the pure title compound as light yellow solid 0.37 g (88%). $^1$H NMR (CDCl$_3$): δ 0.90-0.96 (6H, m), 1.32-1.46 (8H, m), 1.66-1.75 (IH, m), 4.22 (2H, m), 7.75 (IH, s). MS (EI): Calculated, 547.8. found [M+2]$^+$, 549.8.

Synthesis of PSeB1.

2-Ethylhexyl 4,6-dibromoseleno[3,4-b]selenophene-2-carboxylate (7) (0.238 mg, 0.432 mmol) was weighed into a 25 mL round-bottom flask. 2,6-Bis(trimethyltin)-4,8-bis(2-ethylhexyloxy)benzo[1,2-b:4,5-b']dithiophene (8) (334 mg, 0.432 mmol) and Pd(PPh$_3$)$_4$ (30 mg) were added. The flask was subjected to three successive cycles of vacuum followed by refilling with argon. Then, anhydrous DMF (2 mL) and anhydrous toluene (8 mL) were added via a syringe. The polymerization was carried out at 120° C. for 12 hours under nitrogen protection. The raw product was precipitated into methanol and collected by filtration. The precipitate was dissolved in chloroform and filtered with Celite to remove the metal catalyst. The final polymers were obtained by precipitating in hexanes and drying in vacuum for 12 h, yielding 325 mg (92%). $^1$H NMR (CDCl$_3$): δ 0.80-2.40 (45H, br), 3.90-4.70 (6H, br), 7.00-7.90 (2H, br). GPC: Mw (15×10$^3$ g/mol), PDI (1.68).

2,5-Dibromo-3,6-dichloro-1,4-diethylhexyloxybenzene (10).

To a mixture of 2,5-dibromo-1,4-diethylhexyloxybenzene) (8.60 gm, 17.4 mmol) in CH$_3$CN (10 mL) was added NCS (7.00 gm, 52.2 mmol) and anhydrous FeCl$_3$ (0.85 gm, 5.22 mmol). (Z. N. Bao, et al. 1995, *J. Am. Chem. Soc.*, 117, 12426.) The resulted mixture was heated at 55° C. and stirred overnight. The reaction mixture was treated with H$_2$O (100 mL) then extracted with hexane (2×100 mL). The combined organic extracts were dried over anhydrous MgSO$_4$ and concentrated in vacuo to give an oily residue which was purified by column chromatography (hexane:CH$_2$Cl$_2$, 95:5) to give a colorless oil (7.8 gm, 80%). $^1$H NMR(CDCl$_3$): δ 3.87 (m, 4H), 1.81 (m, 2H), 1.31-1.64 (m, 12H), 0.97 (t, J=7.5 Hz, 6H), 0.92 (t, J=7.5 Hz, 6H). MS (EI): Calculated. 561.2. found [M+I]$^+$, 562.2.

2,5-Dichloro-3,6-bis(2-trimethylsilylethynyl)-1,4-diethylhexyloxybenzene (11). Trimethylsilylacetylene (3.1 mL, 21.43 mmol), PdCl$_2$(PPh$_3$)$_2$ (400 mg, 0.6 mmol), and CuI (235 mg, 0.79 mmol) were added successively to a deaerated solution of 2,5-dibromo-3,6-dichloro-1,4-diethylhexyloxybenzene (10) (4.00 g, 7.14 mmol) in diisopropylamine (25 mL) and toluene (55 mL). The resulting mixture was refluxed for 48 hours, then diluted with water (150 mL), and extracted with hexane (2×80 mL). The extract was washed with water (2×80 mL) and dried (MgSO4). Evaporation of the solvent gave an oily residue, which was purified by column chromatography (hexane:CH$_2$Cl$_2$, 98:2) to give an orange-red solid (1.90 gm, 45%). $^1$H-NMR(CDCl$_3$): δ 3.87 (m, 4H), 1.81 (m, 2H), 1.31-1.64 (m, 12H), 0.97 (t, J=7.5 Hz, 6H), 0.92 (t, J=7.5 Hz, 6H). MS (EI): Calculated. 595.8. found [M+I]$^+$, 596.8.

2,6-Bis(trimethylsilyl)-4,8-bis(2-ethylhexyloxy)benzo[1,2-b:4,5-b']diselenophene (12).

To a solution of 11 (1.0 g, 1.67 mmol) in ether (20 mL) at −78° C. was added a pentane solution of tBuLi (1.7 M, 4.0 mL, 7.5 mmol). The resulting mixture was stirred at the same temperature for 30 minutes and then gradually warmed to room temperature. Selenium powder (0.27 g, 3.34 mmol) was then added in one portion, and the resulting mixture was stirred for 30 minutes. After addition of ethanol (30 mL), the mixture was further stirred for 2 h and water was added (50 mL) then extracted with chloroform (3×30 mL). The extract was dried over MgSO4 (anhydrous), and concentrated in vacuo. The residue was purified by column chromatography on silica gel (hexane:CH$_2$Cl$_2$, 98:2) to give colorless microcrystals (0.45 g, 40%): $^1$H-NMR(CDCl$_3$): δ 7.88 (s, 2H), 4.12 (d, J=5.3 Hz, 4H), 1.78 (m, 2H), 1.35-1.70 (m, 12H), 1.03 (t, J=7.4 Hz, 6H), 0.94 (t, J=6.9 Hz, 6H), 0.38 (s, 18H). MS (EI) Calculated. 684.9 found [M+1]$^+$ 685.9.

4,8-bis(2-ethylhexyloxy)benzo[1,2-b:4,5-b']diselenophene (13).

To a solution of 2,6-bis(trimethysilyl)-4,8-bis(2-ethylhexyloxy)benzo[1,2-b:4,5-b']diselenophene (11) (0.29 g, 0.423 mmol) in THF (10 mL) was added 1.3 mL of tetrabutylammonium fluoride (1 M solution in THF). The resulted solution was stirred for 3 hours at room temperature water was added (40 mL) then extracted with chloroform (2×40 mL). The extract was dried over MgSO$_4$ (anhydrous), and concentrated in vacuo. The residue was purified by column chromatography on silica gel (hexane:CH$_2$Cl$_2$, 98:2) to give yellow oil (0.21 g, 92%). $^1$H-NMR(CDCl$_3$): δ 7.90 (d, J=5.9 Hz, 2H), 7.73 (d, J=5.9 Hz, 2H), 4.12 (d, J=5.5 Hz, 4H), 1.80 (m, 2H), 1.35-1.70 (m, 12H), 1.03 (t, J=4.9 Hz, 6H), 0.94 (t, J=4.8 Hz, 6H). MS (EI) Calculated. 540.5 found [M+1]$^+$ 541.5.

2,6-Dibromo-4,8-bis(2-ethylhexyloxy)benzo[1,2-b:4,5-b']diselenophene (14).

Compound 13 (1.08 g, 2.0 mmol) was dissolved in dry CH$_2$Cl$_2$ (35 mL) under N$_2$ and protected from light. NBS (0.906 g, 5.09 mmol) was added in one portion and the mixture stirred for one hour or until TLC indicated complete reaction. The mixture was diluted with hexanes, washed with H$_2$O and brine. The organic layer was dried and the solvent evaporated. The residue was eluted through a column with hexanes to yield pure 5 as an orange oil (1.05 g, 75%). $^1$H-NMR(CDCl$_3$): δ 7.68 (s, 2H), 4.07, (d, J=5.5 Hz, 4H), 1.80 (m, 2H), 1.35-1.70 (m, 12H), 1.03 (t, J=4.9 Hz, 6H), 0.94 (t, J=4.8 Hz, 6H). MS (EI) Calculated. 698.3 found [M+1]$^+$ 699.3.

2,6-Bis(trimethyltin)-4,8-bis(2-ethylhexyloxy)benzo[1,2-b:4,5-b']diselenophene (15).

Compound 14 (0.8 g, 1.14 mmol) was dissolved in freshly distilled THF (30 mL) under $N_2$ and protected from light. The solution was cooled to −78° C. and 2.5 M n-BuLi (1.14 mL) in hexanes was added dropwise. After stirring for 15 minutes, the mixture was allowed to slowly warm to room temperature, during which time the solution became cloudy. To this was added 1 M $SnMe_3Cl$ (1.075 mL) in hexanes dropwise and allowed to stir at room temperature for 12 hours. The mixture was poured into $H_2O$ and extracted with hexanes. The organic layer was extracted three times with $H_2O$, dried to give an orange oil which slowly crystallized. The residue was recrystallized from isopropanol to yield the target monomer as slightly orange needles (0.74 g, 75%). $^1$H-NMR (CDCl$_3$): δ 7.86 (s, 2H), 4.12 (d, J=5.5 Hz, 4H), 1.80 (m, 2H), 1.35-1.70 (m, 12H), 1.03 (t, J=4.9 Hz, 6H), 0.94 (t, J=4.8 Hz, 6H), 0.44 (s, 12H). MS (EI) Calculated. 866.1 found [M+1]$^+$ 866.2

Synthesis of PSeB2.

Compound 7 (0.095 g, 0.173 mmol) was weighed into a dry 10 mL round-bottom flask. Compound 15 (0.15 g, 0.173 mmol) and Pd(PPh$_3$)$_4$ (0.012 g, 0.0103 mmol) were added. The flask was subjected to three successive cycles of vacuum followed by refilling with argon. Then, anhydrous DMF (1 mL) and anhydrous toluene (3 mL) were added via a syringe. The polymerization was carried out at 120° C. for 12 hours under argon protection. The raw product was precipitated into methanol and collected by filtration. The precipitate was dissolved in chloroform and filtered with Celite to remove the metal catalyst. The final polymers were obtained by precipitating in hexanes and drying in vacuum for 12 hours, yielding 0.11 g (45%). $^1$H-NMR (CDCl$_3$): δ 7.90-7.00 (2H, br), 4.70-3.90 (6H, br), 2.40-0.80 (45H, br). GPC: Mw (41×10$^3$ g/mol), PDI (2.68).

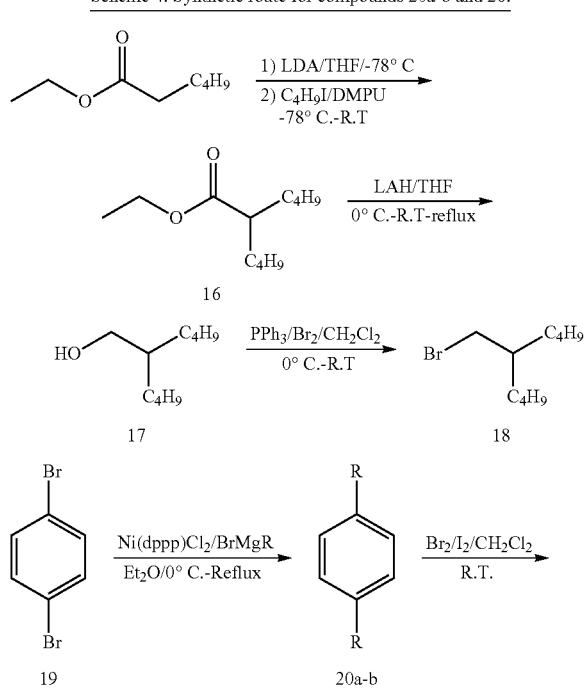

Scheme 4. Synthetic route for compounds 20a-b and 26.

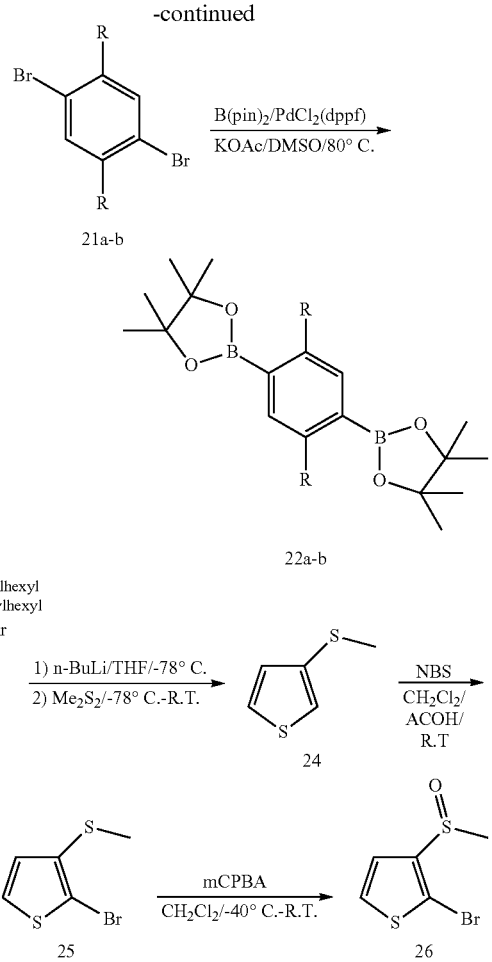

Ethyl 2-butylhexanoate (16)

Diisopropylamine (45.5 g, 450 mmol) was dissolved in anhydrous THF 150 mL and cooled to −40° C. in an acetonitrile/dry ice bath under nitrogen protection. 2.5M n-butyllithium (n-BuLi)/hexane solution (126 mL, 315 mmol) was added with stirring. After the addition, the mixture was kept in the ice water bath for 30 minutes, cooled down to −78° C. in an acetone/dry ice bath, and ethylhexanoate (43.3 g, 300 mmol) was added dropwise. The reaction mixture was stirred at the same temperature for 1 hour and then, iodobutane (60.7 g, 330 mmol) in 1,3-Dimethyl-3,4,5,6-tetrahydro-2(1H)-pyrimidinone (DMPU) (11.5 g, 90 mmol) was added dropwise. The resulting solution was warmed to −40° C., stirred for 2 hours, and kept at room temperature overnight. The reaction mixture was quenched with a saturated NH$_4$Cl aqueous solution, and concentrated via rotary evaporation. Into the flask, 200 mL of Et$_2$O and 200 mL of water were added. After acidification of the mixture using a 2N HCl aqueous solution, the organic layer was separated, washed with 10% (v/v) HCl aqueous solution (150 mL×2), and concentrated via rotary evaporation. The resulting crude yellow oil was purified via vacuum distillation. The compound 16 was collected as colorless oil (45.0 g, 75%). $^1$H NMR (CDCl$_3$): δ 0.86-0.90 (6H, m), 1.07-1.62 (12H, m), 1.25 (3H, t), 2.27-2.32 (1H, m), 4.12 (2H, q). MS (EI): calcd, 200.3. found M+H$^+$, 201.2.

2-Butylhexanol (17)

Compound 16 (54.1 g, 270 mmol) was dissolved in anhydrous THF (450 mL) and cooled in an ice/water bath under nitrogen protection. Lithium aluminum hydride (LAH) (15.3 g, 404 mmol) was added into the reaction flask in small portions. The temperature of the reaction solution was increased to room temperature and then refluxed overnight. The reaction mixture was cooled down to room temperature and poured very slowly into the ice/water solution. The solution was acidified using a 2N HCl aqueous solution, extracted with $Et_2O$ (150 mL×3), and then concentrated via rotary evaporation. The resulting crude oil was purified via vacuum distillation. The compound 17 was collected as colorless oil (32.6 g, 76.2%). $^1H$ NMR ($CDCl_3$): δ 0.87-0.92 (6H, m), 1.17-1.42 (12H, m), 1.40-1.50 (1H, m), 3.53 (2H, d). MS (EI): calcd, 158.3. found M+H$^+$, 159.2.

2-Butylhexylbromide (18)

Bromine (61.4 g, 384 mmol) was added into a solution of triphenylphosphine (100.7 g, 384 mmol) and 450 mL dichloromethane at room temperature under argon protection. Then 2-butylhexanol (60.8 g, 384 mmol) was added dropwise via additional funnel over 50 minutes, the reaction solution was kept to stir at room temperature overnight. Dichloromethane was evaporated, and the concentrate filtered with pentane wash. The filtrate was concentrated via rotary evaporation and the resulting crude yellow oil was purified via vacuum distillation. The title compound was collected as colorless oil (70.8 g, 83.3%). $^1H$ NMR ($CDCl_3$): δ 0.89-0.92 (6H, m), 1.21-1.45 (12H, m), 1.54-1.67 (1H, m), 3.45 (2H, d).

1,4-Di-2-ethylhexylbenzene (20a)

A 500 ml two-necked flask equipped with a reflux condenser attached to a nitrogen gas inlet was charged with 10.1 g (0.422 mol) of magnesium turnings. After heating the reaction mixture for 3 minutes under vacuum and cooling it to room temperature, 200 mL of dry $Et_2O$ was filled and then 54.3 g (0.281 mol) of 2-ethylhexyl bromide in 50 mL dry ether was added dropwise. The solution was refluxed for 3 hours and cooled to room temperature. The prepared 2-ethylhexylmagnesium bromide solution was added dropwise, over 1 h, to an ice-cooled and stirring mixture of 1,4-dibromobenzene (24.5 g, 0.104 mol) and Ni(dppp)$Cl_2$ (0.564 g, 1.04 mmol) in dry ether (300 mL). The cooling bath was removed and the temperature was increased to room temperature. The reaction solution was then refluxed overnight, cooled to 0° C. and carefully quenched with water (50 mL), followed by 2N HCl (300 mL). After separation of the organic layer, the organic layer was washed with water (300 mL) two times and dried with anhydrous sodium sulfate and evaporated in vacuo. Column chromatography (silica gel, hexane) yielded the pure compound 20a (18.2 g, 58%). $^1H$ NMR ($CDCl_3$): δ 0.84-0.92 (12H, m), 1.25-1.35 (16H, m), 1.50-1.58 (2H, m), 2.50 (4H, d), 7.04 (4H, s). MS (EI): calcd, 302.5. found M$^+$, 302.3.

1,4-Di-2-butylhexylbenzene (20b) was synthesized according to the same procedure as 20a with 1,4-dibromobenzene (24 g, 0.102 mol) and 2-butylhexylbromide (54.1 g, 0.245 mol). (18.3 g, 50%) $^1H$ NMR ($CDCl_3$): δ 0.84-0.92 (12H, m), 1.23-1.34 (24H, m), 1.54-1.65 (2H, m), 2.49 (4H, d), 7.03 (4H, S). MS (EI): calcd, 358.6. found M$^+$, 358.2.

1,4-Dibromo-2,5-bis(2-ethylhexyl)benzene (21a)

Catalytic iodine was added to a concentrated $CH_2Cl_2$ solution of 20a (17.9 g, 59.3 mmol). After wrapping the entire flask in aluminum foil to exclude light, bromine (47.4 g, 0.297 mol) was added dropwise. The reaction was stirred for 1 day and 200 mL of $CH_2Cl_2$ was added. The excess bromine was quenched with aqueous sodium bisulfite and the organic part was separated. The organic part was washed with aqueous sodium bicarbonate and dried with anhydrous sodium sulfate. Removal of the solvent and column purification on silica gel using hexane yielded the target product (26.2 g, 96%). $^1H$ NMR ($CDCl_3$): δ 0.81-0.91 (12H, m), 1.23-1.35 (16H, m), 1.64-1.75 (2H, m), 2.57 (4H, d), 7.31 (4H, s). MS (EI): calcd, 460.3. found M$^+$, 460.0.

1,4-Dibromo-2,5-bis(2-butylhexyl)benzene (21b) was synthesized according to the same procedure as 21a with 20b (16.6 g, 46.3 mmol). (22.7 g, 95%) $^1H$ NMR ($CDCl_3$): δ 0.85-0.91 (12H, m), 1.21-1.31 (24H, m), 1.65-1.75 (2H, m), 2.57 (4H, d), 7.31 (4H, s). MS (EI): calcd, 516.4. found M$^+$, 516.2.

2,2'-(2,5-Bis(2-ethylhexyl)-1,4-phenylene)bis(4,4,5,5-tetramethyl-1,3,2-dioxaborolane) (22a).

A flask charged with 21a (26.1 g, 56.8 mmol), bis(pinacolato)-diboron (34.5 g, 0.136 mol), $PdCl_2$(dppf) (2.5 g, 6 mol %), and potassium acetate (33.4 g, 0.341 mol) in 250 mL of DMSO was stirred at 80° C. overnight under a nitrogen atmosphere. After cooling, the solution was concentrated under vacuum, diluted with 150 mL of $CH_2Cl_2$, washed with water and brine, dried (anhydrous $Na_2SO_4$), and the solvent was evaporated. The crude product was purified through column chromatography (silica gel, hexane/EtOAc=20/1). (9.4 g, 30%). $^1H$ NMR ($CDCl_3$): δ 0.86-0.90 (12H, m), 1.15-1.31 (16H, m), 1.33 (24H, s), 1.49-1.57 (2H, m), 2.77 (4H, d), 7.48 (4H, s). MS (EI): calcd, 554.5. found M$^+$, 554.9.

2,2'-(2,5-Bis(2-butylhexyl)-1,4-phenylene)bis(4,4,5,5-tetramethyl-1,3,2-dioxaborolane) (22b) was synthesized according to the same procedure as 22a with 21b (10.4 g, 20.2 mmol). (3.1 g, 25%) $^1H$ NMR ($CDCl_3$): δ 0.83-0.90 (12H, m), 1.17-1.33 (24H, m), 1.34 (24H, s), 1.67-1.78 (2H, m), 2.78 (4H, d), 7.48 (4H, S). MS (EI): calcd, 610.6. found M$^+$, 610.9.

3-Methylthiothiophene (24).

3-Bromothiophene (8.7 g, 53.4 mmol) was dissolved in dry ether (200 mL) under an argon atmosphere, and the solution was cooled to −78° C. A solution of 2.5M n-BuLi in hexane (21.5 mL, 53.8 mmol) was added dropwise and the reaction mixture was stirred at −78° C. for a further 20 minutes. Dimethyldisulfide (12.5 g, 0.133 mol) was then added dropwise and the reaction mixture stirred for 30 min before warming to room temperature. The mixture was then stirred overnight. The reaction solution was quenched with saturated ammonium chloride solution. The separated organic phase was washed with water (2×150 mL) and dried. The solvent was removed via rotary evaporation and the resulting crude yellow oil was purified via vacuum distillation. (3.5 g, 50%) $^1H$ NMR ($CDCl_3$): δ 2.52 (3H, S), 6.97 (1H, q), 7.0 (1H, q), 7.32 (1H, q). MS (EI): calcd, 130.2. found M$^+$, 129.8.

2-Bromo-3-methylthiothiophene (25)

To a stirred solution of compound 24 (6.69 g, 51.34 mmol) in acetic acid (50 mL) and $CH_2Cl_2$ (50 mL) at 0° C. under nitrogen atmosphere, was added N-bromosuccinimide (NBS) (9.14 g, 51.34 mmol) portion wise. The resulting reaction mixture was allowed to warm to room temperature and stirred overnight. The solvent was evaporated under vacuum and then add $CH_2Cl_2$ (150 mL) and water (150 mL). The organic phase was separated and washed with water (2×150 mL). The organic extraction was dried with anhydrous sodium sulfate and evaporated in vacuo. Column chromatography (silica gel, hexane) yields the pure compound 25. (5.37 g, 50%) $^1H$ NMR ($CDCl_3$): δ 2.43 (3H, s), 6.89 (1H, d), 7.25 (1H, d). MS (EI): calcd, 209.1. found M$^+$, 209.9.

2-Bromo-3-methylsulfinylthiophene (26)

To a solution of compound 25 (3.64 g, 17.4 mmol) in $CH_2Cl_2$ (100 mL) at −40° C., was added 3-chloroperbenzoic acid (3 g, 17.4 mmol) in $CH_2Cl_2$ (50 mL) dropwise and the resulting solution was allowed to stir at room temperature overnight. The reaction mixture was washed with aqueous $Na_2CO_3$, dried with anhydrous sodium sulfate and evaporated in vacuum. Column chromatography (silica gel, hexane/

EtOAc (1/2) yields the pure compound 26 (2.74 g, 70%). $^1$H NMR (CDCl$_3$): δ 2.82 (3H, s), 7.35 (1H, d), 7.43 (1H, d). MS (EI): calcd, 225.1. found M$^+$, 210.1=product-16).

27a.

Compound 22a (3.09 g, 5.57 mmol), Compound 26 (3.01 g, 13.4 mmol), 2M aqueous K$_2$CO$_3$ (11 g, 40 mL), and Pd(PPh$_3$)$_4$ (644 mg, 10 mol %) were mixed in Toluene/Ethanol (60/15 mL) under argon atmosphere. The mixture was heated at 110° C. for 24 hours, then cooled. The solution was concentrated in vacuum and CH$_2$Cl$_2$ (150 mL) and water (150 mL) were added. The organic layer was washed with water and brine, dried (anhydrous Na$_2$SO$_4$), and then the solvent was evaporated. The crude product was purified through column chromatography (silica gel, hexane/THF=10/1). (2.4 g, 73%). $^1$H NMR (CDCl$_3$): δ 0.69-0.83 (12H, m), 1.11-1.26 (16H, m), 1.30-1.45 (2H, m), 2.40-2.64 (4H, m), 2.71 (2H, s), 2.81 (4H, s), 7.29 (2H, d), 7.50-7.60 (4H, m). MS (MALDI-TOF): calcd, 591.0. found M$^+$, 587.3.

27b.

Compound 22b (1.75 g, 2.87 mmol), Compound 26 (1.55 g, 6.88 mmol), 2M aqueous NaOH (1.68 g, 21 mL), and Pd(PPh$_3$)$_4$ (332 mg, 10 mol %) were mixed in toluene/ethanol (34/10 mL) under argon atmosphere. The mixture was heated at 110° C. for 24 hours, then cooled. The solution was concentrated in vacuum and CH$_2$Cl$_2$ (100 mL) and water (100 mL) were added. The organic layer was washed with water and brine, dried (anhydrous Na$_2$SO$_4$), and then the solvent was evaporated. The crude product was purified through column chromatography (silica gel, hexane/THF=20/1). (1.2 g, 65%). $^1$H NMR (CDCl$_3$): δ 0.71-0.85 (12H, m), 1.13-1.28 (24H, m), 1.40-1.53 (2H, m), 2.38-2.61 (4H, m), 2.69 (2H, s), 2.78 (4H, s), 7.31 (2H, d), 7.50-7.60 (4H, m). MS (MALDI-TOF): calcd, 647.1. found M$^+$, 646.3.

29a.

A flask was filled with compound 27a (6.9 g, 11.7 mmol), phosphorus pentoxide (627 mg, 4.42 mmol), and trifluoromethanesulfonic acid (150 mL). The mixture was stirred for 3 days at room temperature and then poured into ice-water (1 L). The brown precipitate was collected by suction filtration and dried under vacuum. The crude compound was dissolved in pyridine (200 mL) and heated at 140° C. overnight. The reaction solution was cooled to room temperature, concentrated in vacuum and then, 150 mL of CH$_2$Cl$_2$ and 150 mL of 2N aqueous HCl was added. The extracted organic phase was washed with 2N aqueous HCl (3×150 mL), dried with anhydrous sodium sulfate and evaporated in vacuum. Column chromatography (silica gel, hexane) yields the pure compound 29a (2.47 g, 40%). $^1$H NMR (CDCl$_3$): δ 0.81-0.92 (12H, m), 1.20-1.59 (16H, m), 2.17-2.21 (2H, m), 3.21-3.31 (4H, m), 7.36 (2H, d), 7.56 (2H, d). MS (MALDI-TOF): calcd, 526.9. found M$^+$, 527.0.

29b was synthesized according to the same procedure as 29a with 27b (1.9 g, 2.93 mmol). (0.34 g, 20%) $^1$H NMR (CDCl$_3$): δ 0.82-0.94 (12H, m), 1.20-1.61 (24H, m), 2.15-2.22 (2H, m), 3.19-3.30 (4H, m), 7.34 (2H, d), 7.53 (2H, d). MS (MALDI-TOF): calcd, 583.0. found M$^+$, 583.2.

30a

Compound 29a (0.266 g, 0.505 mmol) was dissolved in 4 mL of CHCl$_3$. Bromine (0.052 mL, 1.01 mmol) solution in 0.5 mL of CHCl$_3$ was added dropwise to the reaction solution. The resulting mixture was stirred at room temperature for 6 hours. The solution was poured into saturated sodium sulfite solution in an ice-water bath and extracted with dichloromethane. The organic extraction was dried with anhydrous sodium sulfate and evaporated in vacuo. Column chromatography on silica gel using hexane and dichloromethane mixed eluent yielded the compound 30a (0.286 g, 83%). $^1$H NMR (CDCl$_3$): δ 0.82 (6H, t), 0.82-0.89 (6H, t) 1.21-1.55 (16H, m), 2.10-2.13 (2H, m), 3.13 (4H, q), 7.35 (2H, s). MS (MALDI-TOF): calcd, 684.7. found M$^+$, 685.6.

30b was synthesized according to the same procedure as 30a with 29b (0.33 g, 0.566 mmol). (0.31 g, 74%) $^1$H NMR (CDCl$_3$): δ 0.79 (12H, t), 1.18-1.51 (24H, m), 2.12-2.22 (2H, m), 3.13 (4H, d), 7.36 (2H, s). MS (MALDI-TOF): calcd, 740.8. found M$^+$, 741.6.

31a

Compound 30a (0.3 g, 0.43 mmol) was dissolved in 10 mL of anhydrous THF and cooled to −78° C. in an acetone/dry ice bath under nitrogen protection. 2.5M n-BuLi/hexane solution (0.35 mL, 0.88 mmol) was added with stirring. After the addition the mixture was kept in the dry ice bath for 25 min, trimethyltin chloride solution (1.12 mL, 1.12 mmol, 1 M solution) was added dropwise, and the mixture was stirred at room temperature overnight. The mixture was quenched with 20 mL of water and extracted with diethyl ether. The organic phase was dried with anhydrous sodium sulfate and evaporated in vacuum. Recrystallization of the residue from CH$_2$Cl$_2$ and isopropanol yields the compound 31a (0.22 g, 60%). $^1$H NMR (CDCl$_3$): δ 0.49 (18H, S), 0.86-0.94 (12H, m), 1.25-1.61 (16H, m), 2.15-2.29 (2H, m), 3.23-3.32 (4H, m), 7.41 (2H, s).

31b was synthesized according to the same procedure as 31a with 30b (0.31 g, 0.42 mmol). (336 mg, 88%) $^1$H NMR (CDCl$_3$): δ 0.46 (18H, S), 0.80 (12H, t), 1.18-1.50 (24H, m), 2.20-2.28 (2H, m), 3.26 (4H, d), 7.38 (2H, s).

Synthesis of Polymers

PTDBD2

2-Butyloctyl 4,6-dibromothieno[3,4-b]thiophene-2-carboxylate (32.7 mg, 0.062 mmol) was weighed into a 10 mL round-bottom flask. 31b (56.3 mg, 0.062 mmol) and Pd(PPh$_3$)$_4$ (3 mg) were added. The flask was subjected to five successive cycles of vacuum followed by refilling with argon. Then, anhydrous DMF (0.4 mL) and anhydrous toluene (1.6 mL) were added via a syringe. The polymerization was carried out at 120° C. for 12 hours under nitrogen protection. The raw product was precipitated into methanol and collected by filtration. The polymer was purified by Soxhlet extraction with hexane, methanol, chloroform and chlorobenzene. The resulting solid from chlorobenzene fraction was obtained after drying in vacuo overnight (30 mg, 50%). $^1$H NMR (CDCl$_2$CDCl$_2$): δ 0.50-2.10 (61H, br), 2.50-2.90 (4H, br), 4.0-4.50 (2H, br), 7.20-7.70 (2H, br). GPC: M$_w$ (108.6×10$^3$ g/mol), PDI (2.82).

PTDBD3 was synthesized according to a similar procedure as PTDBD2 with respective monomers. The $^1$HNMR and gel permeation chromatography (GPC) data of the polymers are listed below.

$^1$H NMR (CDCl$_2$CDCl$_2$): δ 0.40-2.20 (72H, br), 2.50-2.90 (4H, br), 4.0-4.40 (1H, br), 7.20-7.70 (2H, br). GPC: M$_w$ (105.5×10$^3$ g/mol), PDI (2.34).

Device Fabrication.

The polymers PSeB1 and PSeB2 and fullerene acceptor were co-dissolved in the solvent with the PTB1 concentration of 10 mg/ml at 80° C. for 5 hours. The ITO-coated glass substrate was cleaned stepwise in water, acetone and isopropyl alcohol under ultrasonication for 10 to 30 minutes each and subsequently dried in an oven for 5 hours. The ITO was subsequently cleaned with ozone. A thin layer (~30 nm) of PEDOT (poly(ethylenedioxythiophene)):PSS (poly(styrenesulfonate)) (Baytron P VP A1 4083) was spin-coated onto the ITO surface. After being baked at 120° C. for ~20 min, the substrates were transferred into a nitrogen filled glove box (<0.1 ppm O$_2$ & H$_2$O). A ca. 100 nm thick polymer/PCBM composite layer was then spun-cast from the blend solution at 800-1000 rpm on the ITO/PEDOT:PSS substrate without further special treatments. Then the film was transferred into a thermal evaporator located in the same glove box. A 25 nm Ca layer and an 80 nm Al layer were deposited in sequence at the vacuum of $2\times10^{-6}$ Tor. The area of effective area was measured to be 0.095 cm$^2$.

Instrumentation.

UV-Vis Absorption and Cyclic Voltammetry.

The optical absorption spectra were taken by a Shimadzu UV-2401 PC spectrophotometer. Cyclic voltammetry (CV) was used to study the electrochemical properties of the polymers. The polymer thin films coated on glass carbon electrode were studied in a 0.10 M tetrabutylammonium hexafluorophosphate (Bu$_4$NPF$_6$) acetonitrile solution with scan rate at 100 mVs$^{-1}$. For calibration, the redox potential of ferrocene/ferrocenium (Fc/Fc$^+$) was measured under the same conditions, and it is located at 0.1 V to the Ag/Ag$^+$ electrode. It is assumed that the redox potential of Fc/Fc$^+$ has an absolute energy level of $-4.80$ eV to vacuum. (G. Dennler, G.; et al., *Adv. Mater.* 2009, 21, 1323-1338. Scharber, M.; et al., *Adv. Mater.* 2006, 18, 789-794. Coakley, K. M.; et al., *Chem. Mater.* 2004, 16, 4533-4542.)

The energy levels of the highest (HOMO) and lowest unoccupied molecular orbital (LUMO) were then calculated according to the following equations:

$$E_{HOMO}=-(\phi_{ox}+4.74)eV; E_{LUMO}=-(\phi_{red}+4.74)eV$$

where $\phi_{ox}$ is the onset oxidation potential of the second scan from CV data.

Hole Mobility.

Hole mobility was measured according to a similar method described in the literature, using a diode configuration of ITO/PEDOT:PSS/polymer/Al by taking current-voltage current in the range of 0-6 V and fitting the results to a space charge limited form, where the space charge limited current (SCLC) is described by $J=9\in_0\in_r\mu V^2/8 L^3$, where $\in_0$ is the permittivity of free space, $\in_r$ is the dielectric constant of the polymer, $\mu$ is the hole mobility, V is the voltage drop across the device ($V=V_{appl}-V_r-V_{bi}$, $V_{appl}$: the applied voltage to the device; $V_r$: the voltage drop due to contact resistance and series resistance across the electrodes; $V_{bi}$: the built-in voltage due to the difference in work function of the two electrodes), and L is the polymer film thickness. The resistance of the device was measured using a blank configuration ITO/PEDOT:PSS/Al and was found to be about 10-20Ω. The $V_{bi}$ was deduced from the best fit of the $J^{0.5}$ vs $V_{appl}$ plot at voltages above 2.5 V and is found to be about 1.5 V. The dielectric constant, $\in_r$, is assumed to be 3 in the analysis, which is a typical value for conjugated polymers. The thickness of the polymer films is measured by using AFM.

Solar Cell Fabrication and Current-Voltage Measurement

The polymers were co-dissolved with PCBM in chlorobenzene (CB) with or without 3% (v/v) 1,8-diiodooctance in the optimized weight ratios. The polymer concentration was 10 mg/mL. ITO-coated glass substrates (15 Ω/sq) were cleaned stepwise in detergent, water, acetone, and isopropyl alcohol under ultrasonication for 15 minutes each and subsequently dried in an oven for 1 minutes at 80° C. under vacuum. Then after treatment with ultraviolet ozone for 20 minutes, a thin layer of PEDOT:PSS was spin-coated onto ITO surface at 4000 rpm. After being baked at 80° C. for 45 minutes under vacuum, the substrates were transferred into a nitrogen-filled glove box (<0.1 ppm O$_2$ and H$_2$O) for active layer coating and electrode formation. The polymer/PCBM composites layer was then spin-cast from the blend solutions on this substrate. The spin coating speed was 1200 rpm. Then, the film was transferred into a thermal evaporator which is located in the same glove box. A 20 nm Ca layer and 60 nm Al layer were deposited in sequence under vacuum pressure of $2\times10^{-6}$ torr. The effective area of the film was measured to be 0.0314 cm$^2$.

The current density-voltage (J-V) curves were measured using a Keithley 2420 source-measure unit in a nitrogen-filled glove box. The photocurrent was measured under AM 1.5 G illumination at 100 mW/cm$^2$ under Newport Thermal Oriel Sol3A Class AAA Solar Simulators 450 W solar simulator (Model: 94023A, 2 in.×2 in. beam size). The conditions used for device fabrication were repeated to ensure reproducibility. The external quantum efficiency (EQE) measurements were conducted using the Newport Oriel IQE 200 system.

Grazing Incidence Wide-Angle X-Ray Scattering (GI-WAXS)

GIWAXS measurements were performed at the 8ID-E beamline at the Advanced Photon Source (APS), Argonne National Laboratory using x-rays with a wavelength of $\lambda=1.6868$ Å and a beam size of ~100 μm (h) and 50 μm (v). To make the results comparable to those of OPV devices, the samples for the measurements were prepared on PEDOT:PSS modified Si substrates under the same conditions as those used for fabrication of solar cell devices. A 2-D PILATUS 1M-F detector was used to capture the scattering patterns and was situated at 208.7 mm from samples. Typical GISAXS patterns were taken at an incidence angle of 0.20°, above the critical angles of PTDBD polymer or PTDBD:PCBM blends and below the critical angle of the silicon substrate. Consequently, the entire structure of thin films could be detected. In addition, the $q_y$ linecut was obtained from a linecut across the reflection beam center, while the $q_z$ linecut was achieved by a linecut at $q_y=0$ Å$^{-1}$ using the reflected beam center as zero. The background of these linecuts was estimated by fitting an exponential function and the parameters of the scattering peaks were obtained through the best fitting using the Pseudo-Voigt type 1 peak function.

Transmission Electron Microscope (TEM) Measurement

TEM measurement was performed on EI Tecnai F30 at 300 KV, Gatan CCD digital micrograph. Polymer/PCBM Films for TEM were prepared in identical conditions to those prepared for device fabrication on PEDOT:PSS-coated ITO substrates. Samples were immersed in water, and the floating active layer onto water surface was transferred to a TEM grid.

Many modifications and other embodiments of the present disclosure will come to mind to one skilled in the art to which the present disclosure pertains having the benefit of the teachings presented in the foregoing description. It will be apparent to those skilled in the art that variations and modifications of the present disclosure may be made without departing from the scope or spirit of the present disclosure. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A semiconducting polymer of formula (V):

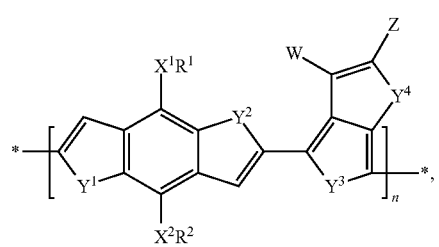

where X$^1$ and X$^2$ are independently selected from the group consisting of O, S, NH, and CH$_2$;

$R^1$ and $R^2$ are independently selected from the group consisting of H, alkyl, alkoxy, aryl, aryloxy, heteroaryl, heteroaryloxy, a cross-linkable moiety, and oligo (ethylene glycol);

each of $Y^1$, $Y^2$, $Y^3$, and $Y^4$ is;

Z is selected from the group consisting of an ester, ketone, amide, cyano, alkyl, polyfluoroalkyl, polychloroalkyl, aryl, and heteroaryl;

W is selected from the group consisting of H, halogen, cyano, dicyanovinyl, and tricyanovinyl; and n is an integer greater than 0.

2. The semiconducting polymer of claim 1, where at least one of $R^1$ and $R^2$ is 2-ethylhexyl.

3. The semiconducting polymer of claim 1, where Z is an ester.

4. The semiconducting polymer of claim 1, where Z is —C(O)OCH$_2$CH(C$_2$H$_5$)C$_4$H$_9$.

5. The semiconducting polymer of claim 1, where W is selected from the group consisting of H and F.

6. The semiconducting polymer of claim 1, which is of the formula:

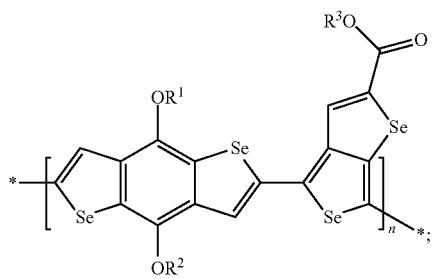

where $R^1$ and $R^2$, and $R^3$ are independently selected from the group consisting of H, alkyl, alkoxy, aryl, aryloxy, heteroaryl, heteroaryloxy, a cross-linkable moiety, and oligo (ethylene glycol).

7. The semiconducting polymer of claim 6, where $R^1$, $R^2$, and $R^3$ are independently 2-ethylhexyl.

8. The semiconducting polymer of claim 1, where n is from about 1 to about 200.

9. A composition comprising the semiconducting polymer of claim 1 and an electron-withdrawing fullerene derivative.

10. The composition of claim 9, where the electron-withdrawing fullerene derivative is selected from the group consisting of [6,6]-phenyl-C$_{61}$-butyric acid methyl ester and [6,6]-phenyl-C$_{71}$-butyric acid methyl ester.

11. A device selected from the group consisting of a solar cell, an optical device, an electroluminescent device, a photovoltaic cell, semiconducting cell, and photodiode, comprising the semiconducting polymer of claim 1.

12. The semiconducting polymer of claim 3, where W is H.

13. The semiconducting polymer of claim 3, where W is F.

14. The semiconducting polymer of claim 4, where W is H.

15. The semiconducting polymer of claim 4, where W is F.

16. A device selected from the group consisting of a solar cell, an optical device, an electroluminescent device, a photovoltaic cell, semiconducting cell, and photodiode, comprising the semiconducting polymer of claim 12.

17. A device selected from the group consisting of a solar cell, an optical device, an electroluminescent device, a photovoltaic cell, semiconducting cell, and photodiode, comprising the semiconducting polymer of claim 13.

18. A device selected from the group consisting of a solar cell, an optical device, an electroluminescent device, a photovoltaic cell, semiconducting cell, and photodiode, comprising the semiconducting polymer of claim 14.

19. A device selected from the group consisting of a solar cell, an optical device, an electroluminescent device, a photovoltaic cell, semiconducting cell, and photodiode, comprising the semiconducting polymer of claim 15.

20. A device selected from the group consisting of a solar cell, an optical device, an electroluminescent device, a photovoltaic cell, semiconducting cell, and photodiode, comprising the semiconducting polymer of claim 4.

* * * * *